United States Patent
Kim et al.

(10) Patent No.: US 9,881,788 B2
(45) Date of Patent: Jan. 30, 2018

(54) BACK SIDE DEPOSITION APPARATUS AND APPLICATIONS

(71) Applicant: Lam Research Corporation, Fremont, CA (US)

(72) Inventors: Yunsang Kim, Monte Sereno, CA (US); Kaushik Chattopadhyay, San Jose, CA (US); Gregory Sexton, Fremont, CA (US); Youn Gi Hong, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 54 days.

(21) Appl. No.: 14/285,544

(22) Filed: May 22, 2014

(65) Prior Publication Data

US 2015/0340225 A1    Nov. 26, 2015

(51) Int. Cl.
*H01L 21/00*    (2006.01)
*H01J 37/00*    (2006.01)
(Continued)

(52) U.S. Cl.
CPC ........ *H01L 21/02271* (2013.01); *C23C 16/02* (2013.01); *C23C 16/44* (2013.01); *C23C 16/458* (2013.01); *C23C 16/52* (2013.01); *H01J 37/32082* (2013.01); *H01J 37/32403* (2013.01); *H01J 37/32715* (2013.01); *H01L 21/02301* (2013.01); *H01L 21/02315* (2013.01); *H01L 21/02345* (2013.01); *H01L 21/67069* (2013.01);
(Continued)

(58) Field of Classification Search
CPC . C23C 16/458; C23C 16/52; H01L 21/67207; H01L 21/67069; H01L 21/02315; H01L 21/02345; H01L 21/02301; H01J 37/32082; H01J 37/32403; H01J 37/32715
USPC ......................................... 118/731
See application file for complete search history.

(56) References Cited

U.S. PATENT DOCUMENTS

| 5,009,738 A | 4/1991 | Greunwald et al. |
| 5,338,363 A | 8/1994 | Kawata et al. |
| (Continued) | | |

FOREIGN PATENT DOCUMENTS

CN    101389415 A    3/2009

OTHER PUBLICATIONS

U.S. Appl. No. 11/479,353, titled "Methods for Removing Deposits From the Edge of a Silicon Substrate Using a Plasma Discharge," by Thomas W. Mountsier, et al., filed Jun. 30, 2006.
(Continued)

*Primary Examiner* — Gordon R Baldwin
*Assistant Examiner* — Charlee Bennett
(74) *Attorney, Agent, or Firm* — Weaver Austin Villeneuve & Sampson LLP

(57) ABSTRACT

The embodiments disclosed herein pertain to methods and apparatus for depositing stress compensating layers and sacrificial layers on either the front side or back side of a substrate. In various implementations, back side deposition occurs while the wafer is in a normal front side up orientation. The front/back side deposition may be performed to reduce stress introduced through deposition on the front side of the wafer. The back side deposition may also be performed to minimize back side particle-related problems that occur during post-deposition processing such as photolithography.

9 Claims, 11 Drawing Sheets

(51) Int. Cl.
*H01L 21/02* (2006.01)
*H01L 27/115* (2017.01)
*C23C 16/52* (2006.01)
*H01L 21/67* (2006.01)
*C23C 16/458* (2006.01)
*C23C 16/02* (2006.01)
*C23C 16/44* (2006.01)
*H01J 37/32* (2006.01)

(52) U.S. Cl.
CPC ...... *H01L 21/67207* (2013.01); *H01L 27/115* (2013.01)

(56) References Cited

U.S. PATENT DOCUMENTS

| | | | |
|---|---|---|---|
| 5,384,008 | A | 1/1995 | Sinha et al. |
| 6,046,097 | A | 4/2000 | Hsieh et al. |
| 6,051,501 | A | 4/2000 | Becker et al. |
| 6,153,012 | A * | 11/2000 | Rupp ................. C23C 16/4584 118/620 |
| 6,279,506 | B1 | 8/2001 | Jurgensen et al. |
| 6,306,245 | B1 | 10/2001 | Yanagisawa et al. |
| 6,838,355 | B1 | 1/2005 | Stamper et al. |
| 7,858,898 | B2 | 12/2010 | Bailey, III et al. |
| 7,943,007 | B2 | 5/2011 | Bailey, III et al. |
| 8,133,322 | B2 | 3/2012 | Nakamura et al. |
| 8,562,750 | B2 | 10/2013 | Chen et al. |
| 2001/0004479 | A1 * | 6/2001 | Cheung ............. H01L 21/02208 427/553 |
| 2002/0179247 | A1 | 12/2002 | Davis et al. |
| 2004/0023475 | A1 | 2/2004 | Bonser et al. |
| 2004/0023502 | A1 | 2/2004 | Tzou et al. |
| 2004/0137745 | A1 | 7/2004 | Houghton et al. |
| 2005/0022740 | A1 * | 2/2005 | Hatano ............... C23C 16/4405 118/723 E |
| 2005/0127361 | A1 | 6/2005 | Hatano et al. |
| 2007/0015374 | A1 * | 1/2007 | Granneman ........ C23C 16/4411 438/758 |
| 2007/0068900 | A1 | 3/2007 | Kim et al. |
| 2007/0224826 | A1 | 9/2007 | Delgadino et al. |
| 2009/0291209 | A1 * | 11/2009 | Granneman ...... C23C 16/45551 427/255.5 |
| 2011/0100955 | A1 * | 5/2011 | Pushparaj ............. B82Y 10/00 216/37 |
| 2012/0097641 | A1 * | 4/2012 | Beckmann ........ H01J 37/32165 216/67 |
| 2013/0183834 | A1 * | 7/2013 | Rogers ............. H01L 21/02263 438/788 |

OTHER PUBLICATIONS

U.S. Appl. No. 12/701,387, titled "Methods for Removing Deposits From the Edge of a Silicon Substrate Using a Plasma Discharge," by Thomas W. Mountsier, et al., filed Feb. 5, 2010.
Office Action received in U.S. Appl. No. 11/479,353, filed Dec. 2, 2008.
Office Action received in U.S. Appl. No. 11/479,353, filed Jun. 1, 2009.
Final Office Action received in U.S. Appl. No. 11/479,353, filed Dec. 7, 2009.
Office Action received in U.S. Appl. No. 12/701,387, filed Sep. 15, 2011.
Final Office Action received in U.S. Appl. No. 12/701,387, filed Feb. 23, 2012.
Notification of the First Office Action dated Apr. 25, 2017 issued in Application No. 201510266980.4.

* cited by examiner

BACK SIDE DEPOSITION APPARATUS AND APPLICATIONS

BACKGROUND

Semiconductor device fabrication often involves deposition of a stack of layers on an underlying wafer substrate. Typically, most deposition and other processing to form the devices occur on the front face of a wafer. As the deposited layers build up, they can introduce stress in the wafer. This stress can cause the wafer to bow, which is undesirable. Where bowing is significant, it can deleteriously affect subsequent processing steps.

Another issue that arises during semiconductor device fabrication is the production of particles on the back side of a wafer during post-deposition processing. These particles can cause local stress effects in the wafer, which are especially problematic during photolithography operations.

Thus, improved methods and apparatus for overcoming issues related to wafer stress and the presence of particles on the back side of a wafer are desired.

SUMMARY

Certain embodiments herein relate to methods and apparatus for depositing a film on a back side of a substrate. Such back side deposition may occur without contacting an active region on the front side of the substrate, thereby preventing damage to the front side of the substrate. Back side deposition may be useful in the context of combating stress that arises due to deposition of materials on the front side of the wafer. Further, back side deposition may be useful for forming a sacrificial layer on the back side of a substrate, which is beneficial in reducing the effect of back side particles. Such back side particles can otherwise cause problems in sensitive processes such as photolithography operations.

In one aspect of the embodiments herein, a method is provided for depositing a film on a back side of a substrate, the method including providing to a deposition reactor a substrate including a front side and a back side, the front side of the substrate including an active region including front side deposited material; securing the substrate in the deposition reactor such that the active region on the front side of the substrate does not contact any portion of the deposition reactor; and depositing the film on the back side of the substrate without depositing film on the front side of the substrate.

In some embodiments, securing the substrate in the deposition reactor includes loading the substrate in or on a support structure in the deposition reactor, where the substrate is loaded such that the active region on the front side of the wafer is exposed to a front side gap and the back side of the wafer is substantially exposed to a deposition region. The method may also include flowing inert gas through the front side gap. Such inert gas helps keep the deposition chemistry out of the front side gap, thereby preventing deposition on the front side of the wafer. In various cases, the film deposited on the back side of the substrate is a dielectric film. Examples of dielectric films that may be deposited include, but are not limited to, silicon oxide and silicon nitride.

The front side deposited material may cause the substrate to bow in certain cases. Depositing the film on the back side of the substrate may include depositing the film to a thickness sufficient to reduce the bow of the wafer to a bow height of about 150 μm or less. In these or other cases, depositing the film on the back side of the substrate may include depositing the film to a thickness sufficient to reduce a magnitude of stress in the wafer to about 150 MPa or below. For instance, the thickness of the film deposited on the back side of the wafer may be less than about 2 μm, and this thickness may be less than a thickness of the front side deposited material.

In certain embodiments, the film deposited on the back side of the substrate is a sacrificial layer. The sacrificial layer may be removed during later processing steps. In one embodiment, the method further includes after depositing the film on the back side of the substrate, further processing the front side of the substrate through one or more processes selected from the group consisting of etching, deposition, ion implantation, plasma cleaning, and wet cleaning, where further processing the front side of the substrate results in the formation of particles on the film; and removing the film, where removing the film also removes the particles on the film. The method may further include performing photolithography on the substrate after the film is removed.

In another embodiment, the method further includes before depositing the film on the back side of the substrate, processing the front side of the substrate through one or more processes selected from the group consisting of etching, deposition, ion implantation, plasma cleaning, and wet cleaning, where processing the front side of the substrate results in the formation of particles on the back side of the substrate; where depositing the film on the back side of the substrate occurs such that the particles on the back side of the substrate are covered with the film; performing photolithography while the film is present on the back side of the substrate; and removing the film from the back side of the substrate after performing photolithography.

In another aspect of the disclosed embodiments, an apparatus for depositing a film on a back side of a substrate is provided, the apparatus including: a reaction chamber; a substrate support mechanism in the reaction chamber configured to support the substrate at or near its periphery such that an active region on a front side of the substrate does not contact any portion of the deposition reactor, and such that a back side of the substrate is substantially exposed; a deposition region defined on one side by the bottom side of the substrate, when present; a front side gap defined on one side by the front side of the substrate, when present; a top side inlet for providing gas to the front side gap; and a deposition region inlet for providing gas to the deposition region.

The apparatus may further include a controller having instructions for depositing the film on the back side of the substrate without depositing film on the front side of the substrate. For instance, the controller may have instructions to flow one or more reactant gases through the deposition region inlet, and to flow inert gas through the top side inlet. The controller may also have instructions to control a height of the front side gap by moving the substrate support mechanism and/or a surface above the substrate support mechanism. In these or other cases, one or more parts of the reactor may be movable such that a height of the front side gap and/or a height of the deposition region may be changed.

The substrate support mechanism may include a support ring in some cases. In other cases, a plurality of pegs may be used as the substrate support mechanism.

In a further aspect of the disclosed embodiments, a multi-tool semiconductor processing apparatus is provided including: a front side module for depositing material on a front side of a substrate; a back side module for depositing material on a back side of the substrate without substantially contacting an active region on the front side of the substrate, where the back side module is configured to deliver gas phase reactants; and a controller having instructions for depositing material on the front side of the substrate in the front side module, transferring the substrate to the back side module, and depositing material on the back side of the substrate without concurrently depositing film on the front side of the substrate. The multi-tool apparatus may further include an etching module for etching the substrate.

These and other features will be described below with reference to the associated drawings.

DETAILED DESCRIPTION

Figure 1A:
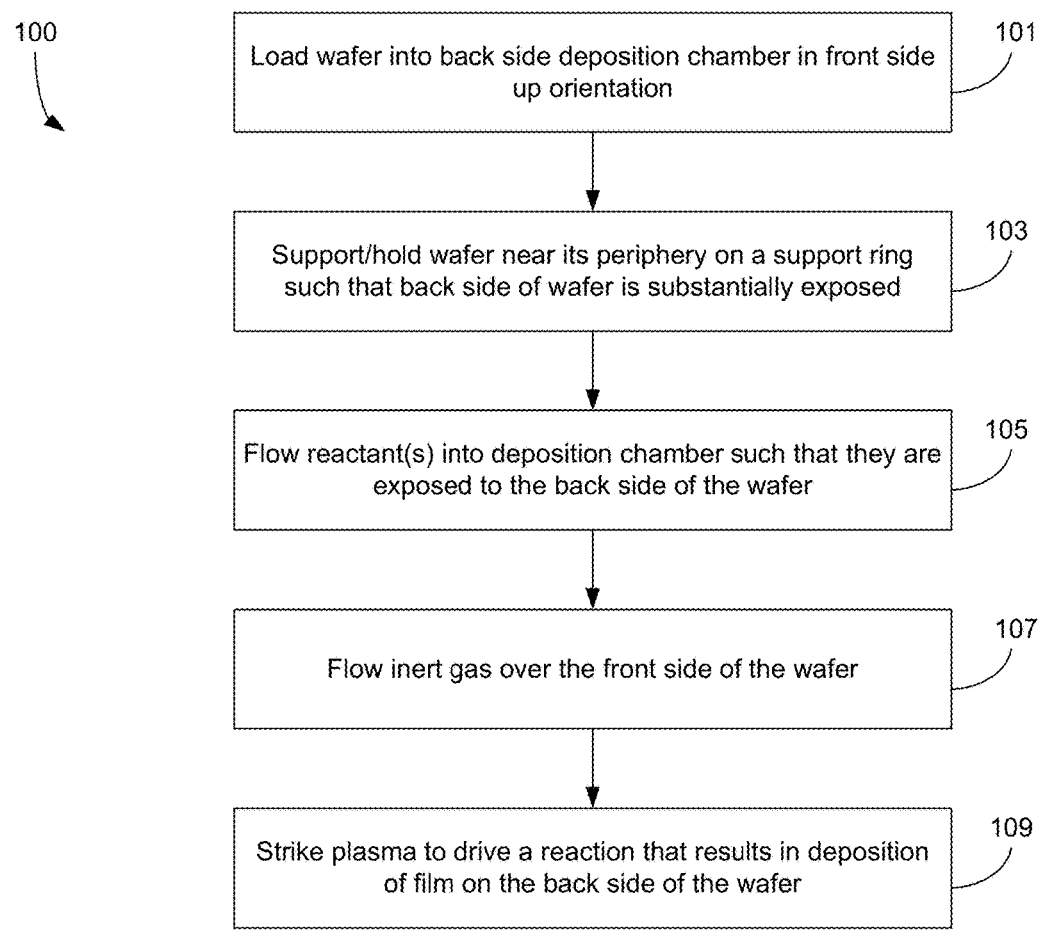
FIG. 1A presents a flowchart for a method of depositing a film on the back side of a wafer.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 or 300 mm, though the industry is moving toward adoption of 450 mm diameter substrates. The description herein uses the terms "front" and "back" to describe the different sides of a wafer substrate. It is understood that the front side is where most deposition and processing occurs, and where the semiconductor devices themselves are fabricated. The back side is the opposite side of the wafer, which typically experiences minimal or no processing during fabrication.

The flow rates and power levels provided herein are appropriate for processing on 300 mm substrate, unless otherwise specified. One of ordinary skill in the art would appreciate that these flows and power levels may be adjusted as necessary for substrates of other sizes. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Methods

As discussed above, deposition of materials on the front of a wafer substrate can lead to stress and bowing problems in the wafer. These problems are especially likely to occur where large stacks of materials are deposited, for example in the context of 3D-NAND devices. Wafer bowing can cause complications in subsequent processing steps. For instance, the wafer may fail to chuck correctly if the bowing is too great. Further, certain processing steps (e.g., photolithography) are very precise and produce poor results if the wafer is not substantially flat when processing.

One technique for combating the stress and bowing issues is to deposit a film on the back side of the wafer. The back side film counteracts the stress from the front side deposition to result in a neutral stress (or substantially neutral stress, e.g., less than about +/−150 MPa) wafer that shows no bowing (or substantially no bowing, e.g., less than about 150 μm of bow). If the film deposited on the front side is tensile, then the back side film should also be tensile to balance out the overall stress. Likewise, if the front side film is compressive, then the back side film should also be compressive. The back side film may be deposited through various reaction mechanisms (e.g., chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), etc). In various cases, plasma enhanced chemical vapor deposition is used due to the high deposition rate achieved in this type of reaction.

Certain deposition parameters can be tuned to produce a back side film having a desired stress level. One of these deposition parameters is the thickness of the deposited back side film. Thicker films induce more stress in the wafer, while thinner films (of the same composition and deposited under the same conditions) induce less stress in the wafer. Therefore, in order to minimize the amount of material consumed in forming the back side layer, this layer may be deposited relatively thinly under conditions that promote formation of a highly stressed film.

Other parameters that may be adjusted to affect the stress induced by the back side (or front side) film include the power at which the plasma is generated (e.g., the RF power), the RF frequency of plasma, the exposure time of the plasma, temperature of the substrate and reaction chamber, pressure within the reaction chamber, flow of inert gas, composition of reactants, etc. This paragraph relates to the changes seen in a silicon nitride film under different deposition conditions. As the high frequency (HF, e.g., about 13.5 MHz) component of the RF power used to generate the plasma increases, the tensile stress response of the film increases, and the compressive stress response shows substantially no change. Example HF RF frequencies may range between about 13.56-60 MHz. Example HF RF powers may range between about 0-2500 Watts per station. As the low frequency (LF, e.g., about 356 kHz) component of the RF power used to generate the plasma increases, the tensile stress response of the film decreases, and the compressive stress response of the film increases. Example LF RF frequencies may range between about 200 KHz-4 MHz. Example LF powers may range between about 0-2500 Watts per station. In various cases, the LF+HF powers together may range between about 0-2500 Watts per station. As the plasma exposure time and/or duty cycle increases, the stress response may change as indicated above depending on the frequency used and the type of film stress involved. Example RF exposure times depend on the type of deposition occurring. For instance, plasma enhanced chemical vapor deposition involves exposure to plasma for relatively long periods of time, while plasma enhanced atomic layer deposition involves repeated exposure to plasma for much shorter periods of time. As the temperature of the substrate during deposition increases, both the tensile and compressive stress responses of the film increase. Example substrate and chamber temperatures also depend on the deposition process, but may be between about 20-400° C. As the pressure in the reaction chamber during deposition increases, the tensile stress response of the film increases, and the compressive stress response of the film decreases. Example chamber pressures range between about 1-4 Torr. As the inert gas flow delivered to the reaction chamber during deposition increases, the tensile stress response shows no change, and the compressive stress response increases. Example flow rates for inert gas may be between about 100-5000 sccm. Another parameter that may affect film stress is the electrode spacing. The electrode spacing is important because it affects the E-field on the wafer, which can affect on-film density. As the electrode spacing increases, there is no response in the tensile stress response, and the compressive stress response decreases. Example electrode spacing may be between about 5-30 mm. Other reaction parameters related to back side deposition will be further discussed below.

Another variable that can affect the degree of stress in a film is the hydrogen content of the film which can be controlled by the flow of $NH_3$ or other hydrogen-containing reactant. One or more of the variables discussed above may also directly or indirectly affect the hydrogen content of the film. Films having lower hydrogen content show more neutral stress levels. One technique for modifying the stress induced by the front side deposition is to form films having lower hydrogen contents (on the wafer front side). However, the hydrogen content of a film also has a significant effect on the dielectric constant of the film. Thus, there is only a narrow window in which the hydrogen content can be modified while maintaining a desired dielectric constant. Back side deposition overcomes the problem related to the small processing window available for depositing the front side materials.

As mentioned, stacks of deposited materials are especially likely to result in wafer stress and bowing. One example stack that may cause these problems is a stack having alternating layers of oxide and nitride (e.g., silicon oxide/silicon nitride/silicon oxide/silicon nitride, etc.). Another example stack likely to result in bowing includes alternating layers of oxide and polysilicon (e.g., silicon oxide/polysilicon/silicon oxide/polysilicon, etc.). Other examples of stack materials that may be problematic include, but are not limited to, tungsten and titanium nitride. The materials in the stacks may be deposited through chemical vapor deposition techniques such as plasma enhanced chemical vapor deposition (PECVD), low pressure chemical vapor deposition (LPCVD), metal organic chemical vapor deposition (MOCVD), atomic layer deposition (ALD), plasma enhanced atomic layer deposition (PEALD), or through direct metal deposition (DMD), etc. These examples are not intended to be limiting. Certain disclosed embodiments may be useful whenever wafer stress and/or bowing are induced due to material present on the front side of the wafer.

The front side stacks may be deposited to any number of layers and thicknesses. In a typical example, the stack includes between about 32-72 layers, and has a total thickness between about 2-4 µm. The stress induced in the wafer by the stack may be between about −500 MPa to about +500 MPa, resulting in a bow that is frequently between about 200-400 µm (for a 300 mm wafer), and even greater in some cases.

The material deposited on the back side of the wafer may be a dielectric material in various embodiments. In some cases, an oxide and/or nitride (e.g., silicon oxide/silicon nitride) is used. Examples of silicon-containing reactants that may be used include, but are not limited to, silanes, halosilanes, and aminosilanes. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethyl silane, di-t-butylsilane, allylsilane, sec-butyl silane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethyl silane, dichloromethyl silane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$). Other potential silicon-containing reactants include tetraethyl orthosilicate (TEOS), and cyclic and non-cyclic TEOS variants such as tetramethoxysilane (TMOS), fluorotriethoxysilane (FTES), Trimethylsilane (TMS), octamethyltetracyclosiloxane (OMCTS), tetramethylcyclotetrasiloxane (TMCTSO), dimethyldimethoxysilane (DMDS), hexamethyldisilazane (HMDS), hexamethyldisiloxane (HMDSO), hexamethylcyclotrisiloxane (HMCTSO), dimethyldiethoxysilane (DMDEOS), methyltrimethoxysilane (MTMOS), tetramethyldisiloxane (TMDSO), divinyltetramethyldisiloxane (VSI2), methyltriethoxysilane (MTEOS), dimethyltetramethoxydisiloxane (DMTMODSO), ethyltriethoxysilane (ETEOS), ethyltrimethoxysilane (ETMOS), hexamethoxydisilane (HMODS), bis(trimethylsiloxy) ethane (BTEOSE), bis(trimethoxysilyl) ethane (BTMOSE), dimethylethoxysilane (DMEOS), tetraethoxydimethyldisiloxane (TEODMDSO), tetrakis (trimethylsiloxy)silane (TTMSOS), tetramethyldiethoxydisiloxane (TMDEODSO), triethoxysilane (TIEOS), trimethoxysilane (TIMEOS), or tetrapropoxysilane (TPOS).

Example nitrogen-containing reactants include, but are not limited to, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Examples of oxygen-containing co-reactants include oxygen, ozone, nitrous oxide, carbon monoxide, nitric oxide, nitrogen dioxide, sulfur oxide, sulfur dioxide, oxygen-containing hydrocarbons ($C_xH_yO_z$), water, mixtures thereof, etc.

The flow rate of these reactants will depend greatly on the type of reaction through which the back side layer is deposited. Where CVD/PECVD are used to deposit the back side layer, the flow rate of the silicon-containing reactant may be between about 0.5-10 mL/min (before atomization), for example between about 0.5-5 mL/min. The flow rate of a nitrogen-containing reactant, oxygen-containing reactant, or other co-reactant may be between about 3-25 SLM, for example between about 3-10 SLM.

In certain implementations the back side layer may be removed after further processing. Where this is the case, the composition of the back side layer should be chosen such that it can be easily removed from the substrate at an appropriate time. In this regard, there should be a high selectivity between the material of the back side layer (e.g., the dielectric) and the material of the underlying substrate (e.g., silicon) in the desired removal chemistry.

The optimal thickness of the back side layer will depend on the amount of stress induced by the deposition on the front side of the wafer, as well as the conditions under which the back side layer is deposited. The back side layer may be deposited to a thickness at which the stress in the wafer becomes negligible (e.g., less than about 150 MPa). In these or other embodiments, the back side layer may be deposited to a thickness at which the wafer bow becomes negligible (e.g., less than about 150 μm of bow). In some cases, this corresponds to a back side layer thickness between about 0.1-2 μm, for example between about 0.3-2 μm, or between about 0.1-1 μm, or between about 0.3-1 μm. Where silicon nitride is used to form the back side layer, a film having a thickness of about 0.3 μm is sufficient to mitigate a bow of about 50-200 μm. As mentioned above, a higher stress back side layer may be used to reduce the required thickness of the layer. This helps conserve materials and reduce costs.

In certain cases, the back side deposition may be accomplished by removing the wafer from a deposition tool, flipping it over, placing it back in the deposition tool upside down, and depositing on the wafer back side while the wafer is in its upside down position. Additional process steps are required in order to protect the front side of the wafer during back side deposition. For example, before the wafer is removed and flipped, one or more protective layers may be deposited on the wafer front side. These protective layers shield the important underlying device layers/structures such that damage to the valuable wafer front side is minimized. Without deposition of the protective layers, substantial damage to the wafer front side may occur as the wafer is handled, transferred, chucked and de-chucked, etc. in its upside down orientation. For instance, an unprotected wafer front side may be scraped, dented, or otherwise damaged when it comes into contact with a chuck. Though the protective layers are beneficial in shielding the wafer during back side deposition, formation of the protective layers involves extra processing steps and material that could be avoided where direct back side deposition is available.

Thus, in certain other cases the back side deposition is carried out in an apparatus that is specifically designed to deposit on the back side of a wafer, even when the wafer is in its right-side-up orientation (i.e., with the front side of the wafer pointing upwards). This approach eliminates the need to form a protective layer on the front side of the wafer before the backside deposition occurs. The protective layer is no longer needed because back side deposition may occur without anything handling or otherwise contacting the front side of the wafer. In some embodiments, a deposition apparatus may be used to deposit on both the front and back side of a wafer, without flipping the wafer over (i.e., the deposition apparatus can perform both front side deposition and back side deposition without altering the orientation of the wafer). Where this is the case, various components of the apparatus may be included at both the top and bottom of the reaction chamber (e.g., showerhead or other inlets, outlets, plates or other components for providing a thin gap between the current non-plating face of the wafer and the plate, electrical connections, etc.).

FIG. 1A provides a flowchart for a method of depositing a film on the back side of a wafer. The method 100 begins with step 101, where the wafer is loaded into a back side deposition chamber. An appropriate back side deposition chamber is further described in relation to FIGS. 4A and 4B, below. The wafer is loaded in a right-side-up orientation, with the front side of the wafer pointing upwards toward the top of the chamber. At step 103 (which may occur concurrently with step 101), the wafer is supported/held by a support ring positioned at the periphery of the wafer. The ring is positioned to support the wafer above a gap where deposition will occur. This gap is sometimes referred to as the deposition region, and includes the area below the back side of the wafer and above any hardware (e.g., showerhead or other inlets, which may act as a lower electrode) positioned at the bottom of the chamber. The ring is shaped such that the back side of the wafer is substantially exposed to the deposition region. In some embodiments, the ring and top electrode positioned above the wafer may be movable such that the height of the deposition region is variable. The top electrode may be a ground plate in various cases, and may or may not be heated. This movability may help provide processing flexibility.

At step 105, one or more gas phase reactants are flowed into the reaction chamber such that the back side of the wafer is exposed to the reactants. The inlet or inlets for introducing the reactants may be positioned below the support ring, with the reactants entering directly into the deposition region. In some cases a showerhead placed at the bottom of the chamber/deposition region is used to deliver the reactants. At step 107, which may happen concurrently with step 105, inert gas is flowed over the front side of the wafer. Typically, the gas is delivered to a relatively small gap, also referred to as the front side gap, positioned directly above the front side of the wafer. The front side gap should be relatively small/short, for example having a height less than the thickness of the plasma sheath. The front side gap is typically about coextensive with the face of the wafer. Use of a short front side gap helps ensure that the front side of the wafer is protected during deposition on the back side, since the plasma is unable to penetrate the small front side gap. The inert gas delivered to the front side gap further helps protect the front side of the wafer. In certain cases, the inert gas is delivered to the front side gap near the center of the wafer. From here, the inert gas flows outward over the wafer's front side. This flow pattern helps sweep any deposition-causing reactants from the front side gap, which further protects the front side from deposition or other damage. The flow rate of inert gas delivered to the front side of the wafer may be between about 100-5000 sccm. In various cases the top surface that defines the front side gap (e.g., a heater, a ground plate, a chamber ceiling, a showerhead, or other surface) is movable, such that the height of the front side gap is adjustable. This may provide more flexibility and ease of access for loading and unloading wafers, and may also help provide process flexibility by allowing the chamber geometry to be modified between or during processes.

The method 100 continues at step 109, where a plasma is generated to drive a reaction that results in deposition of material on the back side of the wafer. In certain embodiments, the substrate may be DC grounded during deposition. The plasma may generated between the upper and lower electrodes to produce a capacitively coupled plasma in many cases. Step 109 may occur concurrently with steps 105 and 107, for example where deposition occurs through a PECVD reaction. In other cases (e.g., where deposition occurs through ALD processes), the reactant delivery and plasma generation may occur in a cyclic fashion, and may or may not overlap. Reactant delivery and timing are discussed further below, though one of ordinary skill in the art would appreciate that any appropriate type of deposition scheme (reaction type, reactant timing, plasma timing, use of sweeps/purges, etc.) may be used. Reactant delivery 105, inert gas delivery 107, and plasma exposure 109 continue (or are repeated) until the back side film is deposited to a desired thickness.

Chemical vapor deposition, including plasma enhanced chemical vapor deposition, is often the method of choice for depositing silicon oxide films or other films on the back side of a substrate. In CVD reactions, one or more gas phase reactants are delivered to a reaction chamber and undergo a gas phase reaction that deposits a product on the surface of a substrate in the reaction chamber. Where PECVD is used, the gas phase reaction is driven by exposure to the plasma. PECVD reactions are especially useful for back side deposition because they achieve a rapid deposition rate and allow the stress of the back side layer to be tuned as desired. PECVD reactions may also be particularly useful because they are less conformal than other methods (e.g., ALD and CFD), the lower conformality being helpful in the context of covering back side particles, discussed further below.

One alternative to CVD is atomic layer deposition processing and plasma enhanced atomic layer deposition processing. ALD/PEALD methods involve self-limiting adsorption of reactant gases and can provide thin, conformal dielectric films. ALD methods have been developed for the deposition of silicon oxide and other types of film. Films produced by ALD are very thin (e.g., about one monolayer); therefore, numerous ALD cycles may be repeated to reach a film having a desired thickness, and it may take a relatively long time to reach the desired thickness compared to a CVD process.

In contrast with a CVD process, where activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, energy provided to the substrate (e.g., thermal or plasma energy) activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between about 0.5-3 Å thick.

A related deposition technique that presents a feasible alternative to CVD is conformal film deposition (CFD). Generally, CFD does not rely on complete purges of one or more reactants prior to reaction to form the film. For example, there may be one or more reactants present in the vapor phase when a plasma (or other activation energy) is struck. Accordingly, one or more of the process steps described in an ALD process (e.g., a purge/sweep step) may be shortened or eliminated in an example CFD process. In some cases, a reactant may be provided continuously. The continuously provided reactant is often a co-reactant/auxiliary reactant (e.g., an oxygen- or nitrogen-containing reactant, as opposed to a primary reactant such as one that contributes silicon to a final film). It is generally necessary, even in CFD processes, to minimize the amount of non-adsorbed principal reactant in the reaction chamber when the chamber is exposed to plasma. Otherwise, a gas phase CVD reaction may result. Typically, a chamber capable of performing an ALD process is also capable of performing a CFD process, and as used herein, a CFD process is considered to be a type of ALD process.

Another technique for combating the stress and bowing issues described herein is to include a stress compensating layer on the front side of the wafer. The stress compensating layer may be deposited under conditions that result in a particular level of stress that offsets the stress from the rest of the front side layers. For instance, if the front side deposition (excluding the stress compensating layer) results in a compressive stress, the front side stress compensating layer may be deposited under conditions that result in tensile stress, thereby offsetting the compressive stress from the remaining front side layers. Such a stress compensating layer may be positioned on top of a stack of layers (e.g., alternating layers of oxide and polysilicon, or alternating layers of oxide and nitride, etc.) and under a hard mask layer, in some cases. This configuration may be especially relevant in the context of fabricating a 3D-NAND device.

Figure 1B:
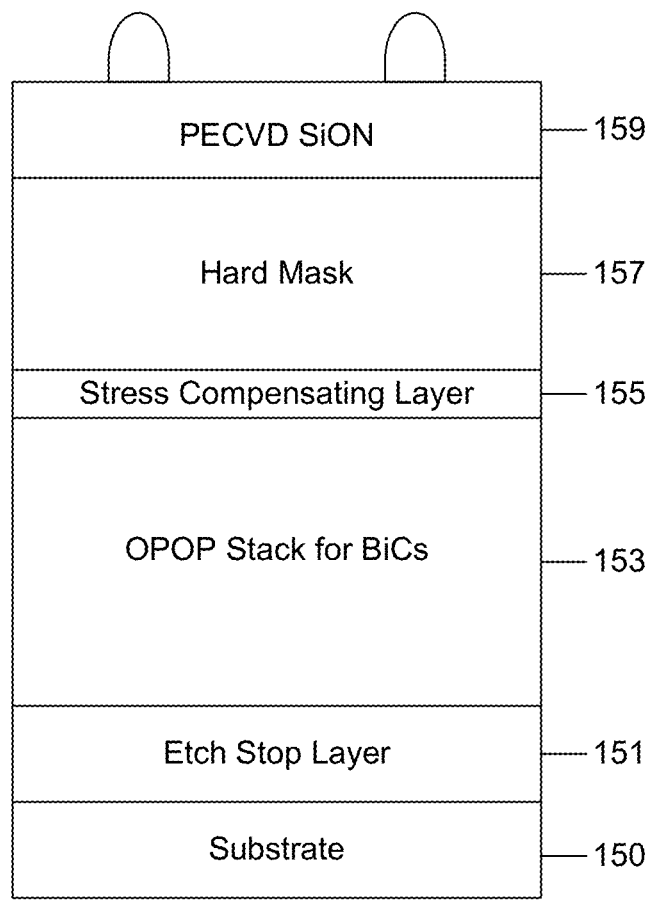
FIG. 1B depicts a cross-sectional view of a substrate having a front side stress compensating layer according to certain embodiments.

FIG. 1B illustrates a substrate 150 having an etch stop layer 151, a stack of alternating oxide/polysilicon layers 153, a front side stress compensation layer 155, a carbon-containing hard mask layer 157, and a PECVD-deposited silicon oxynitride layer 159. In certain embodiments, the stress compensating layer 155 may also be an etch stop layer. The optimal thickness of the front side stress compensating layer 155 will depend on the stress induced by the other front side layers, as well as the stress of the compensating layer 155 itself. Stress compensating layers that are deposited at greater stress levels can effectively combat stress at thinner thicknesses than layers that are less stressed. In some embodiments, the stress compensating layer is about 0.1 µm thick or greater. In these or other embodiments, the stress compensating layer may be about 1 µm thick or less. In a particular example, the stress compensating layer is about 0.3 µm thick.

The stress compensating layer may be made from various materials that exhibit high levels of stress. In some cases, the layer is made from a highly compressive or highly tensile oxide or nitride material. Front side stress compensating layers may also be made from highly stressed metal layers in some embodiments. For instance, tungsten film may be deposited at a high degree of tensile stress. Such a tungsten layer may be deposited in or on a stack of materials. The tungsten layer may act as both a stress compensating layer and as a hard mask layer. In other cases, the tungsten layer acts as a stress compensating layer and is provided together with another layer that acts as a hard mask. In many cases the material chosen for the stress compensating layer should be easily removable by wet and/or dry etching processes. In certain embodiments, the stress compensating layer may be removed during subsequent processing, for example after a photolithography operation in some cases. The stress compensating layer may be removed through an etching or cleaning process, for example. The stress level of the stress compensating layer may be tuned by controlling deposition parameters as described elsewhere herein.

Another advantage of stress compensating layers, whether present on the front side or back side of a wafer, is that a broader processing window is achieved with respect to the material used for a hard mask layer. In general, it is desirable to use a hard mask material that is highly selective. However, many highly selective hard mask materials also tend to have high levels of stress. Thus, in order to avoid exacerbating wafer stress problems, these highly selective hard mask materials are typically not used where wafer stress is an issue. On the other hand, where wafer stress is counteracted with a front or back side stress compensating layer, even the highly selective, relatively high stress hard mask materials may be used. In this case, the stress compensating layer may be designed to combat stress induced by all of the front side deposited materials, including the hard mask layer.

Figure 2A:
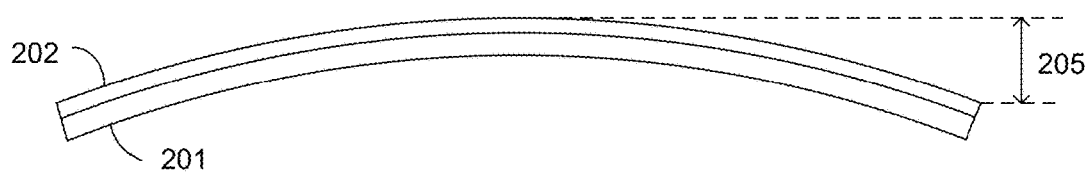
FIG. 2A illustrates a bowed wafer with a stack of deposited materials thereon.
Figure 2B:
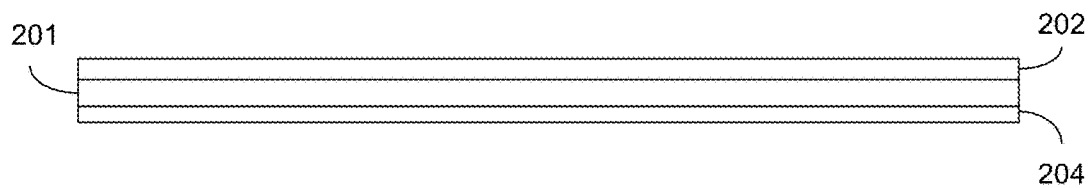
FIG. 2B illustrates the wafer shown in FIG. 2A after deposition of a layer of material on the back side of the wafer.

FIGS. 2A and 2B illustrate the wafer stress problem described above. FIG. 2A shows a wafer 201 having a stack of materials 202 deposited thereon. The deposited stack 202 stresses the underlying wafer 201, resulting in the bowed shape seen in FIG. 2A. FIG. 2B shows the same wafer 201 with the stack of materials 202 deposited on the front side, as well as back side layer 204 deposited on the back side. The back side layer 204 counteracts the stress introduced by the front side stack 202. This stress offset results in a much flatter substrate, with little to no bow. The thicknesses of the wafer 201, front side stack 202, and back side layer 204 are not necessarily to scale. Further, the degree of bowing may be exaggerated in FIG. 2A to better illustrate the problem. In certain cases, an acceptable tolerance for wafer bowing is less than about 150 µm, as measured vertically from the lowermost height of the wafer to the uppermost height of the wafer. This distance is marked in FIG. 2A as height 205.

While back side deposition is useful in combating stress and bowing, it may also be beneficial in other contexts, as well. For example, back side deposition can be used to address problems that arise due to the formation of particles on the wafer back side. As mentioned above, certain post-deposition processes (e.g., etching, ion implantation) result in the formation of particles on the back side of a wafer. These particles can be problematic in subsequent processing, such as during photolithography operations.

The backside particles are harmful because they result in localized stress and deformation of the wafer, especially when the wafer is electrostatically chucked on a flat surface such as in a lithography operation. As a wafer is chucked, it deforms around any particles that are present on the bottom side of the wafer. This deformation induces localized stress in the wafer. The local stress and deformation are problematic during photolithography, and can cause de-focusing issues during processing. It has been shown that the location of back side particles on a wafer strongly correlates with the location of photolithography defects. Therefore, it is desirable to remove or otherwise counteract the effect of the back side particles, especially before a photolithography operation (or other sensitive operation) takes place.

Figure 3A:
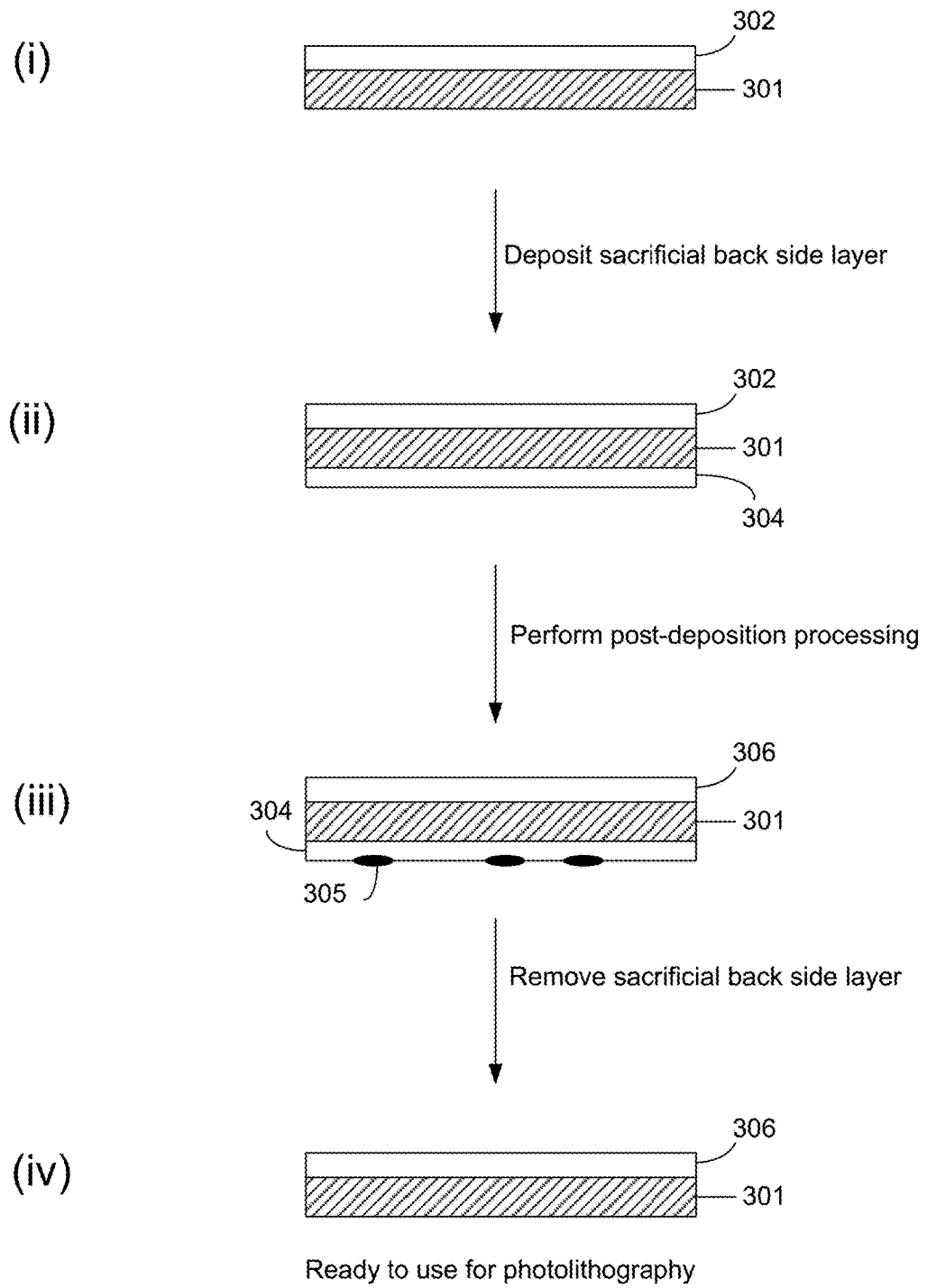
FIGS. 3A and 3B depict cross-sectional views of a portion of a semiconductor substrate at various points during fabrication according to certain embodiments that utilize a sacrificial back side layer.
Figure 3B:
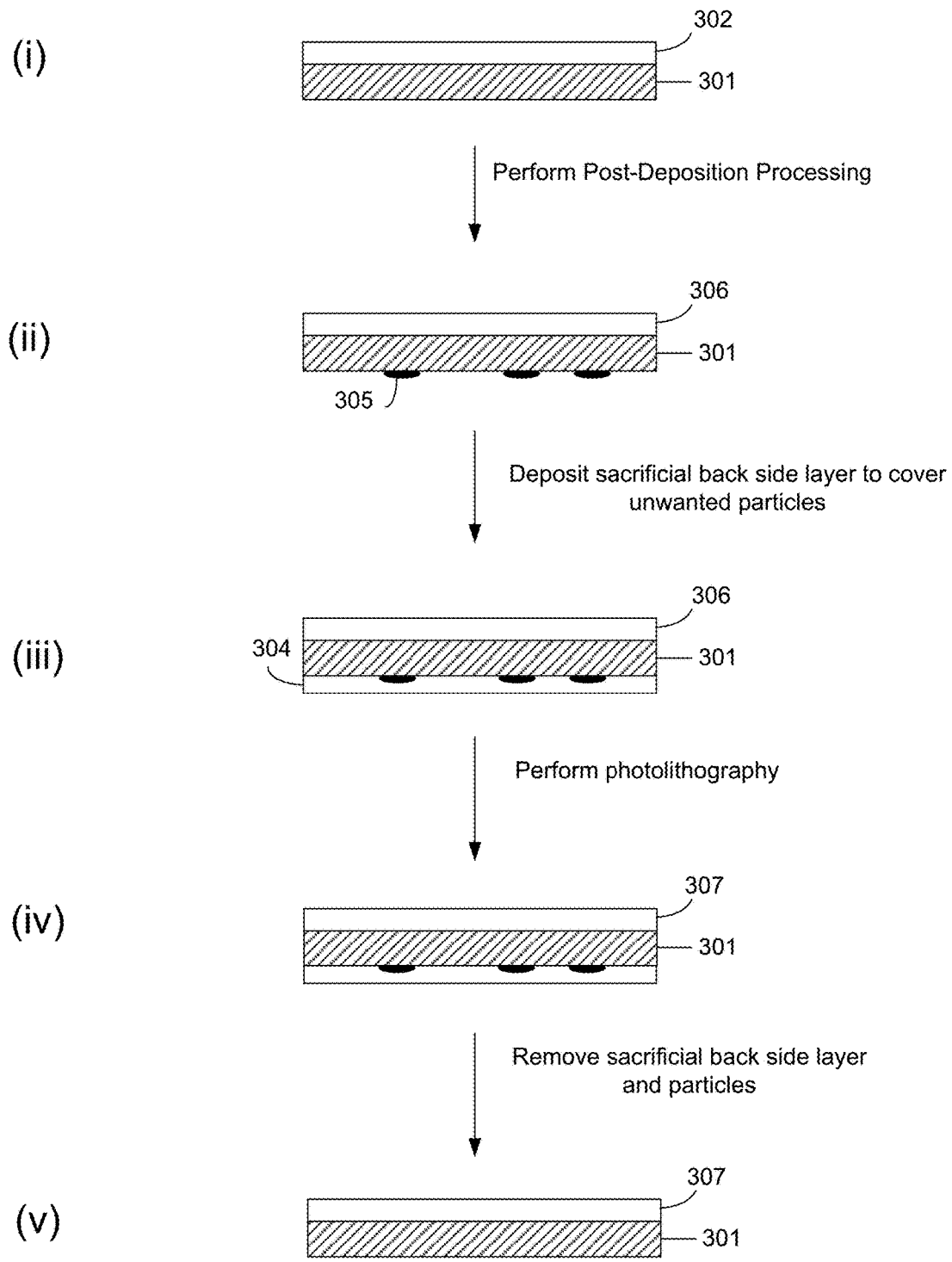

In certain embodiments, the harmful effects of back side particles are minimized through the use of a sacrificial layer deposited on the wafer back side. FIGS. 3A and 3B present two implementations that utilize such a sacrificial layer. The embodiments shown in these figures are provided in the context of preparing a substrate for a photolithography operation. One of ordinary skill in the art would appreciate that the lithography operation may be substituted for any other process having similar sensitivities (e.g., requiring a substrate that is very flat globally and locally). The size of the layers and particles shown in FIGS. 3A and 3B may be exaggerated for the purpose of illustration.

FIG. 3A shows cross-sectional views in panels (i)-(iv) of a portion of a wafer during various stages of fabrication. In this embodiment, a sacrificial layer is deposited before back side particles are generated. To compare, in the embodiment of FIG. 3B, the sacrificial layer is deposited after the back side particles are generated. Returning to the embodiment of FIG. 3A, a substrate 301 is provided with front side deposition 302 thereon, as shown in panel (i). The front side deposition 302 may be a stack of materials, as discussed above. The front side deposition 302 may also be any other type of deposition, and may include any number of layers, structures, features, devices, etc. Moving from panel (i) to (ii), a sacrificial back side layer 304 is deposited on the back side of the wafer 301. Next, moving from panel (ii) to (iii), post-deposition processing is performed, which forms modified front side deposition 306. The post-deposition processing may involve etching, ion implantation, annealing, cleaning, etc. Oftentimes, the post-deposition processing results in the formation of particles 305 on the back side of the wafer. Here, because the sacrificial back side layer 304 is present, the particles 305 form on the sacrificial layer 304. After the particle-forming post-deposition processing is complete, the sacrificial back side layer 304, along with the particles 305, may be removed (moving from panel (iii) to panel (iv) in FIG. 3A). The back side layer 304 may be removed through any appropriate process. Both wet processing and dry processing are available, though wet methods are generally more efficient. Once the sacrificial layer 304 and particles 305 have been removed, the wafer is ready for photolithography processing. Because the particles are no longer present, the lithography may proceed as desired on the extremely flat wafer, and the amount of lithography defects is significantly reduced compared to cases where no back side deposition is used.

As mentioned above, the sacrificial layer should be made of a material that can be easily removed from the underlying wafer. In other words, there should be good selectivity between the sacrificial layer and the wafer material in the desired removal chemistry. In many cases, the sacrificial layer is a dielectric material such as silicon oxide or silicon nitride, though other materials may be used, as well. The sacrificial layer should be deposited to a thickness sufficient to counteract the local deformation and stress effects caused by the particles. This is typically a relatively thin thickness, for example between about 500-3000 Å. Typically, the layer is thin enough such that it introduces substantially no additional stress to the wafer (except in embodiments where the sacrificial layer is also used to balance a stress induced from the front side layer). In other words, the layer is sometimes sufficiently thin that it does not cause bowing or other stress problems, but in some cases may be thick enough to counteract bowing/stress problems resulting from front side deposition.

FIG. 3B shows cross-sectional views in panels (i)-(v) of a portion of a wafer during stages of fabrication in an alternative embodiment. This technique starts off the same way as shown in FIG. 3A, with a wafer 301 having front side deposition 302. Moving from panel (i) to (ii), post-deposition processing is performed. In this embodiment, the post-deposition processing occurs before any back side deposition occurs. The processing results in the formation of particles 305, which adhere directly to the wafer 301. The processing also changes the front side deposition in some way, and the front side deposition as modified by the post-deposition processing is labeled 306. Next, moving from panel (ii) to (iii), a sacrificial back side layer 304 is deposited. The layer 304 is deposited to a thickness sufficient to cover the particles 305 and provide an extremely flat surface on the exposed bottom side of the wafer. Moving from panel (iii) to (iv), photolithography is performed. This changes the front side deposition 306 to form photolithography-modified front side deposition 307. It is understood that front side deposition layers 302, 306, and 307 all relate to the deposition on the front of the wafer at different points during processing. The sacrificial layer 304 provides an extremely flat surface on the bottom of the wafer, thereby minimizing or eliminating the local deformation and stress problems caused by the particles 305. Thus, even though lithography occurs while the particles 305 are still on the wafer 301, their presence is not harmful to lithography. The particles are not problematic in this case because the flat sacrificial layer 304 comes into contact with the electrostatic chuck to adequately chuck the wafer without any deformation around the particles 305. Next, moving from panel (iv) to panel (v), the sacrificial back side layer is removed. The process of removing the back side layer 304 also removes the particles 305 to leave a clean, flat wafer. As mentioned above, the back side layer 304 may be removed through wet or dry methods.

Apparatus

The methods described herein may be performed by any suitable apparatus. A suitable apparatus includes hardware for accomplishing the process operations (e.g., hardware for performing a back side deposition without contacting (or minimally contacting) the wafer front side) and a system controller having instructions for controlling process operations in accordance with the present invention. For example, in some embodiments, the hardware may include one or more process stations included in a process tool.

Figure 4A:
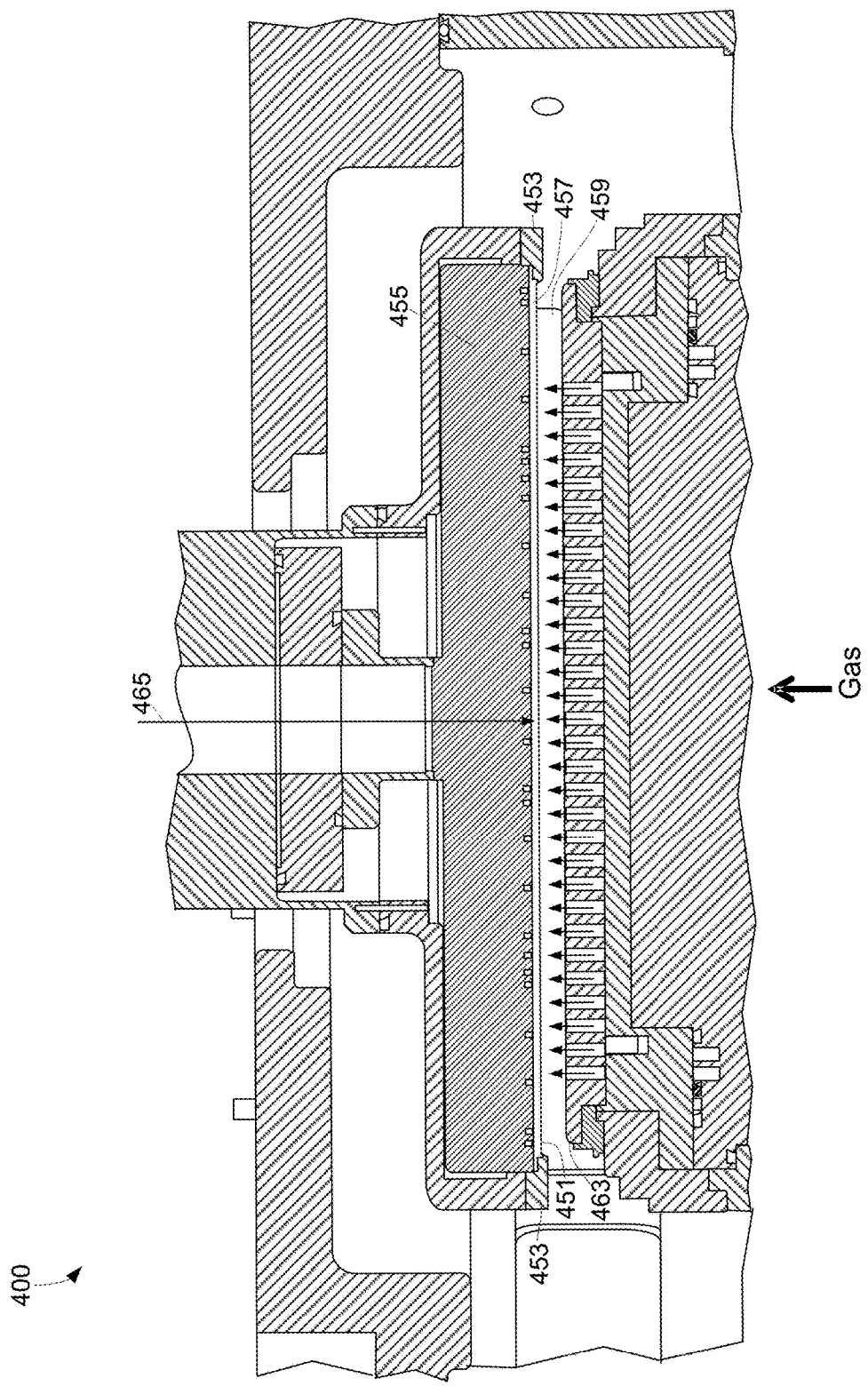
FIG. 4A shows a simplified view of a reaction chamber that may be used to deposit material on the back side of a wafer according to certain embodiments.
Figure 4B:
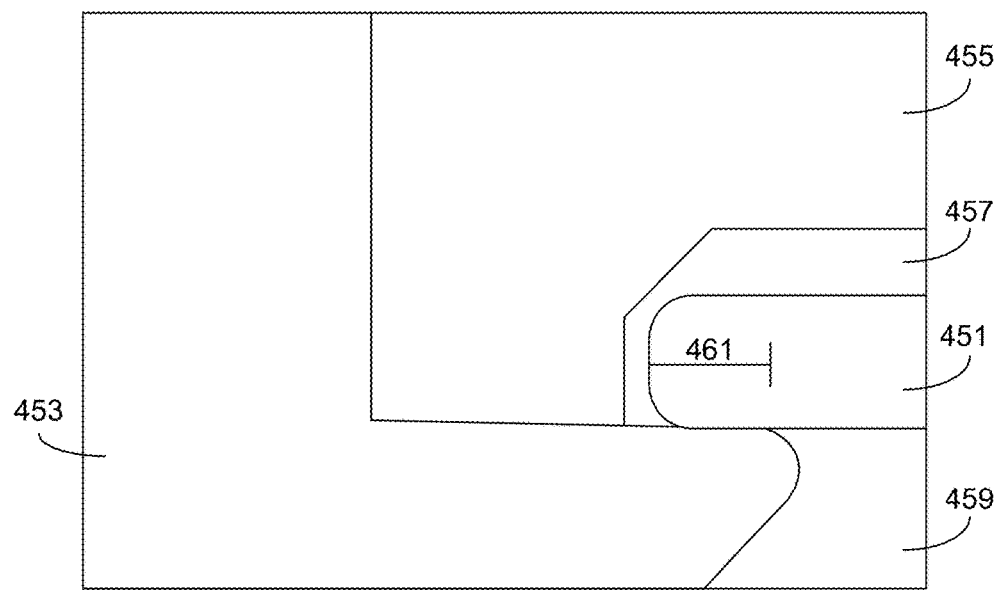
FIG. 4B shows a close up view of a portion of the back side deposition apparatus shown in FIG. 4A.

FIG. 4A shows a cross-sectional view of a simplified version of an apparatus 400 capable of depositing on the back side of a wafer 451 (wafer 451 is shown as a black horizontal line in FIG. 4A). FIG. 4B shows a close up view of a portion of the apparatus 400. In particular, FIG. 4B illustrates how the wafer 451 is supported in the apparatus 400. The wafer 451 is supported at or near its periphery by a wafer support ring 453. The support ring 453 may contact the wafer 451 on the wafer's bottom surface, near the wafer edge in a region referred to as the support contact region. The support contact region is annularly shaped, and may be very small such that substantially the entire back side of the wafer (e.g., at least about 95%, or at least about 99%, as measured by surface area) is exposed during deposition. In some embodiments, the support contact region on the bottom of a wafer extends from the edge of the wafer inwards by about 5 mm or less, for example by about 1 mm or less. In the example of FIG. 4B, the support contact region is on the bottom of wafer 451, extending inwards from the periphery of the wafer by distance 461. The support ring 453 may also contact the top side of a wafer near the wafer edge. In these cases, the support contact region extend to the top side of the wafer. In this embodiment, the support ring may have a local cross-section that is C-shaped (rather than L-shaped as shown in FIG. 4B), extending both under and over a portion of the wafer at its periphery. Where the support ring contacts the top side of a wafer, care should be taken to ensure that the support ring does not damage the front side of the wafer. Such care may include ensuring that the support ring only contacts the wafer front side in a small defined area (the support contact area), and not in an active area. In some embodiments, the support contact area on the top of the wafer extends radially inward from the edge of the wafer by no more than about 0.5 mm, or by no more than about 0.25 mm.

In some embodiments, the support ring may be replaced with another wafer support mechanism that supports the wafer at/near its periphery. One example is a series of three or more disconnected pegs that support the wafer at different locations around its edge. In some cases the pegs may wrap around the wafer to better secure it in place during processing. The pegs (or other support mechanisms) may contact the wafer within the support contact regions described above.

In any case, the mechanism for holding the substrate may be designed such that the front side of the wafer does not substantially contact any portion of the reactor. As used herein, this means that any contact between the front side of the wafer 451 and the wafer support mechanism 453 (e.g., support ring, pegs, etc.) or other portion of the apparatus happens only near the edge of the wafer. The front side of the wafer includes an active region, where devices are fabricated, surrounded by a non-active peripheral region. The non-active peripheral region is present due to the geometry of the wafer and the need to handle the wafer during processing. By ensuring that the active region on the front side of the wafer does not contact any portion of the reactor, damage to the front side of the wafer may be minimized or avoided altogether. Contact that occurs at the very edge of the front side is not problematic in many cases, because the peripheral non-active region is typically removed and discarded when the substrate is cut into individual devices. As such, contact that happens in this region is not fatal to the final devices formed on the wafer.

Returning to the embodiment of FIGS. 4A and 4B, the support ring 453 holds the wafer 451 over the deposition region 459. The deposition region 459 is the area where reactant gases are introduced, reacted, and deposited on the wafer 451. The deposition region 459 is at least about coextensive with the area of the wafer 451. The bottom of the deposition region 459 may be defined by a lower surface 463, which in this embodiment also acts as a showerhead 463. The lower surface 463 is typically substantially parallel to the wafer 451. The height of the deposition region 459 (measured as the distance between the bottom side of the wafer 451 and the lower surface) may be relatively small in many cases. For example, the deposition region 459 may have a height between about 5-30 mm, for example between about 15-25 mm. In some embodiments, at least one of the lower electrode/showerhead surface 463 and support ring 453 is movable such that the height of the deposition region 459 may be tuned.

As mentioned, the lower surface 463 defines the bottom of the deposition region 459. In various implementations, the bottom surface 463 is powered (e.g., with an RF power source). In some embodiments, the lower surface 463 is adapted to act as a showerhead to provide process gases as needed. In other embodiments, the lower surface 463 may be simpler, and process gases may be provided through alternate inlets. Showerhead designs that may be adapted for use in a back side deposition chamber are further discussed in the following U.S. patents and patent applications, each of which is incorporated herein in its entirety: U.S. Pat. No. 8,147,648, filed Aug. 15, 2008, and titled "COMPOSITE SHOWERHEAD ELECTRODE ASSEMBLY FOR A PLASMA PROCESSING APPARATUS"; and U.S. patent application Ser. No. 13/828,176, filed Mar. 14, 2013, and titled "COMPOSITE SHOWERHEAD ELECTRODE ASSEMBLY FOR A PLASMA PROCESSING APPARATUS."

Various different types of plasma may be used. For instance, the plasma may be generated directly in the deposition region 459 (i.e., a direct plasma) or may be generated at a different location and piped into the deposition region (i.e., a remote plasma). Any appropriate plasma generator may be used. In various embodiments the plasma is a capacitively coupled plasma generated between a powered lower electrode/showerhead 463 below the wafer 451 and a grounded upper electrode/top surface 455 above the wafer.

Above the wafer 451 is a small front side gap 457. This gap 457 extends between the top surface of the wafer 451 and an upper surface 455 in the reaction chamber. The size of the gap in FIG. 4A is exaggerated for the purpose of illustration. The upper surface 455 may be a heater, a ground plate, a chamber ceiling, or another type of plate/surface. In many cases this upper surface 455 acts as an electrode. In some embodiments, the height of the front side gap 457 is about 0.5 mm or smaller, for example about 0.35 mm or smaller. In these or other embodiments, the height of the front side gap 457 may be at least about 0.1 mm or bigger, for example at least about 0.25 mm or bigger. In many cases this upper surface 455 is substantially parallel to the wafer. This upper surface/electrode 455 may also extend around the edge of the substrate as shown in FIG. 4B such that it comes into contact with the wafer support ring 453. During deposition, inert gas (e.g., N$_2$, Ar, etc.) is introduced from a front side inlet 465 and passes over the front side of the wafer 451. The front side inlet 465 may be positioned at or near the center of the wafer 451, such that the inert gas flows from the center of the wafer outward. This outward flowing inert gas helps ensure that no deposition-causing gases enter the front side gap 457 or come into contact with the front side of the wafer 451. In other words, the inert gas flow helps ensure that no material is able to deposit on the front side of the wafer 451 during back side deposition. To further protect the front side of the wafer 451, the front side gap 457 may be designed such that it is smaller than the thickness of the plasma sheath. This helps ensure that the plasma does not enter the front side gap where it could damage the substrate.

In many cases, the plasma is a capacitively coupled plasma that is generated between an upper electrode and a lower electrode. In certain cases the upper electrode may be connected with ground, and the lower electrode may connected with an RF source. The lower electrode may operate in part to collect electrons from the plasma. Dual RF (e.g., using and controlling both LF and HF frequencies and powers) may be used to modulate the stress of a deposited film in various cases.

In some embodiments, the back side deposition reactor is a bevel cleaning apparatus that has been modified to perform back side deposition. One example of a processing apparatus that may be modified is the Coronus® plasma bevel clean apparatus from Lam Research of Fremont, Calif. This apparatus is further discussed in the following U.S. patents, each of which is incorporated by reference in its entirety: U.S. Pat. No. 7,858,898, filed Jan. 26, 2007, and titled "BEVEL ETCHER WITH GAP CONTROL"; U.S. Pat. No. 7,943,007, filed Jan. 26, 2007, and titled "CONFIGURABLE BEVEL ETCHER"; and U.S. Pat. No. 8,562,750, filed Dec. 17, 2009, and titled "METHOD AND APPARATUS FOR PROCESSING BEVEL EDGE."

Modifications useful for performing back side deposition typically include installation of a different wafer holder (e.g., an annular wafer holder that supports the wafer at its periphery and allows the back side of the wafer to remain exposed to plasma during processing), and installation of (or modification to) a different gas delivery system (e.g., to deliver deposition gases to the deposition region under the back side of the wafer, while also delivering inert gas to the front side gap above the front side of the wafer). Further, a heater and/or ground plate may be added above the wafer, if not already present.

Figure 5:
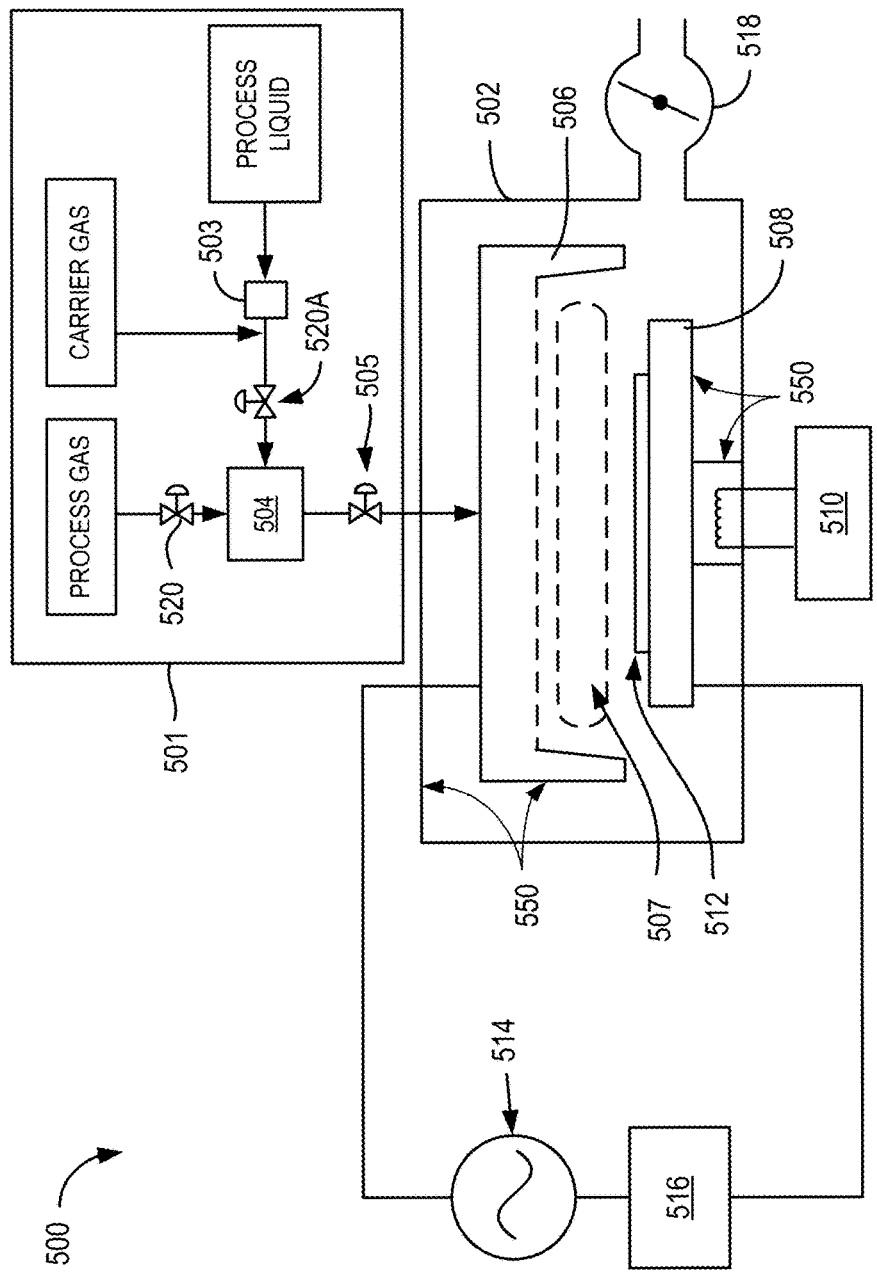
FIG. 5 depicts a simplified cross-sectional view of a reaction chamber that may be used to deposit material on the front side of a wafer according to certain embodiments.

FIG. 5 shows a cross-sectional view of a simplified version of a process station 500 for depositing film on the front side of a wafer. For simplicity, process station 500 is depicted as a standalone station having a process chamber body 502 for maintaining a low-pressure environment. However, it will be appreciated that a plurality of process stations 500 may be included in a common process tool environment. Further, it will be appreciated that, in some embodiments, one or more hardware parameters of process station 500 may be adjusted programmatically by one or more computer controllers.

Process station 500 fluidly communicates with reactant delivery system 501 for delivering process gases to a distribution showerhead 506. Reactant delivery system 501 includes a mixing vessel 504 for blending and/or conditioning process gases for delivery to showerhead 506. One or more mixing vessel inlet valves 520 may control introduction of process gases to mixing vessel 504.

Some reactants may be stored in liquid form prior to vaporization and subsequent delivery to the process station. The embodiment of FIG. 5 includes a vaporization point 503 for vaporizing liquid reactant to be supplied to mixing vessel 504. In some embodiments, vaporization point 503 may be a heated vaporizer. The saturated reactant vapor produced from such vaporizers may condense in downstream delivery piping when adequate controls are not in place (one way to combat this is to include helium when vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

As mentioned, in some embodiments the vaporization point 503 is a heated liquid injector. A liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller upstream of vaporization point 503 may be provided for controlling a mass flow of liquid for vaporization and delivery to process station 500. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 506 distributes process gases toward substrate 512. In the embodiment shown in FIG. 5, substrate 512 is located beneath showerhead 506, and is shown resting on a pedestal 508. It will be appreciated that showerhead 506 may have any suitable shape, and may have any suitable number and arrangement of ports for distributing processes gases to substrate 512.

In some embodiments, a microvolume 507 is located beneath showerhead 506. Performing a CFD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 508 may be raised or lowered to expose substrate 512 to microvolume 507 and/or to vary a volume of microvolume 507. For example, in a substrate transfer phase, pedestal 508 may be lowered to allow substrate 512 to be loaded onto pedestal 508. During a deposition on substrate process phase, pedestal 508 may be raised to position substrate 512 within microvolume 507. In some embodiments, microvolume 507 may completely enclose substrate 512 as well as a portion of pedestal 508 to create a region of high flow impedance during a deposition process.

Optionally, pedestal 508 may be lowered and/or raised during portions of the deposition process to modulate process pressure, reactant concentration, etc., within microvolume 507. In one scenario where process chamber body 502 remains at a base pressure during the process, lowering pedestal 508 may allow microvolume 507 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 508 may allow a plasma density to be varied during plasma activation and/or treatment cycles included in the deposition process. At the conclusion of the deposition process phase, pedestal 508 may be lowered during another substrate transfer phase to allow removal of substrate 512 from pedestal 508.

While the example microvolume variations described herein refer to a height-adjustable pedestal, it will be appreciated that, in some embodiments, a position of showerhead 506 may be adjusted relative to pedestal 508 to vary a volume of microvolume 507. Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers.

Returning to the embodiment shown in FIG. 5, showerhead 506 and pedestal 508 electrically communicate with RF power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert (e.g., helium) and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, for example where atomic layer deposition is used, much shorter plasma strikes may be applied during a processing cycle. These may be on the order of 50 ms to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD/CFD cycles.

In some embodiments, pedestal 508 may be temperature controlled via heater 510. Further, in some embodiments, pressure control for process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to process station 500.

The internal surfaces of the process station 500 may be coated with a conditioning layer 550, which may include an undercoat and/or a pre-deposition coat. Examples of surfaces that become coated with the conditioning layer include the chamber walls 502, the chamber ceiling and floor, the pedestal 508 and the showerhead 506.

Suitable apparatus and methods for performing front side deposition are further discussed in the following U.S. patents and patent applications, each of which is incorporated by reference in its entirety: U.S. patent application Ser. No. 13/084,399, filed Apr. 11, 2011, and titled "PLASMA ACTIVATED CONFORMAL FILM DEPOSITION"; U.S. application Ser. No. 14/158,536, filed Jan. 17, 2014, and titled "METHOD AND APPARATUS FOR THE REDUCTION OF DEFECTIVITY IN VAPOR DEPOSITED FILMS"; and U.S. Pat. No. 8,101,531, filed Sep. 23, 2010, and titled "PLASMA-ACTIVATED DEPOSITION OF CONFORMAL FILMS." One example of a suitable apparatus for performing front side deposition is the VECTOR® product family from Lam Research Corp. of Fremont, Calif.

Figure 6:
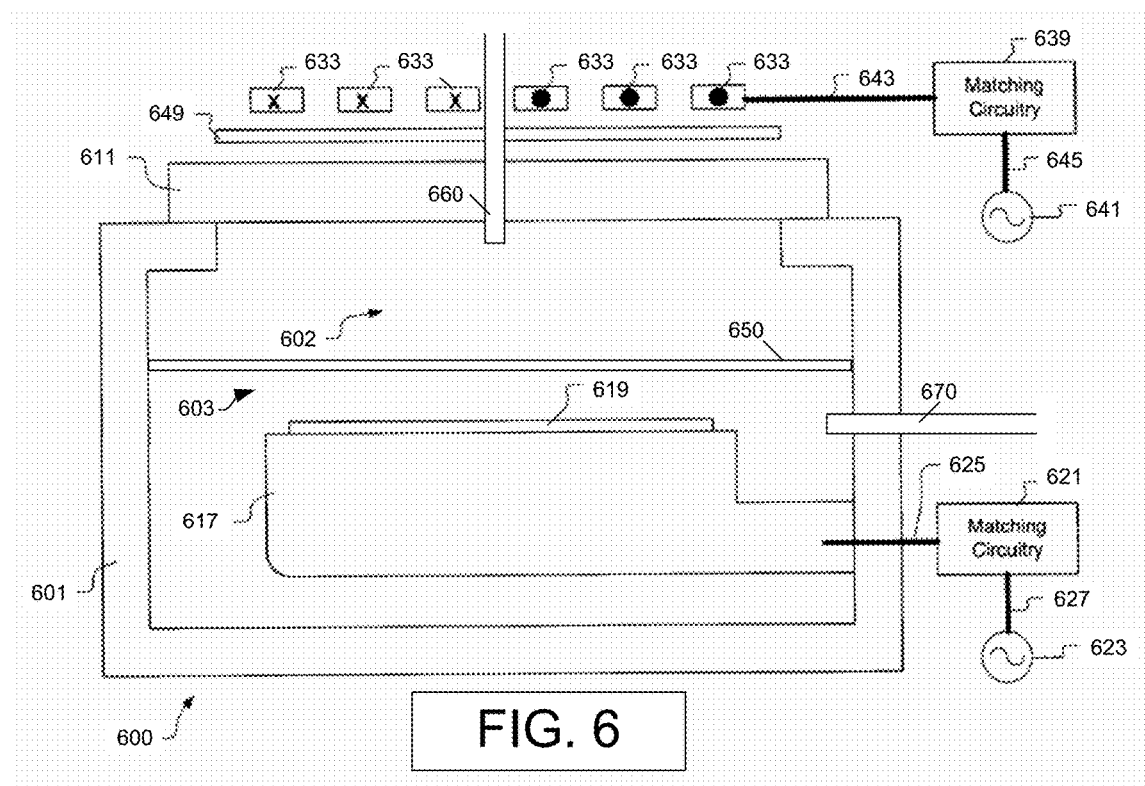
FIG. 6 illustrates a simplified cross-sectional view of an etching chamber that may be used in some embodiments.

FIG. 6 depicts a cross-sectional view of an inductively coupled reaction chamber/tool 600 that may be used to etch a substrate in certain embodiments. The embodiments herein may be practiced with non-inductively coupled plasmas, as well. The inductively coupled plasma etching apparatus 600 includes an overall etching chamber structurally defined by chamber walls 601 and a window 611. The chamber walls 601 are typically fabricated from stainless steel or aluminum. The window 611 is typically fabricated from quartz or other dielectric material.

An optional internal plasma grid 650 may divide the overall etching chamber into an upper sub-chamber 602 (where plasma is generated) and a lower sub-chamber 603 (where the substrate is processed). In certain other implementations, a more complex plasma grid assembly is used. For example, the plasma grid assembly may include multiple grids, as well as support structures and movement causing elements. The plasma grid 650 or grid assembly may be used to promote formation of an ion-ion plasma in the lower sub-chamber 603, where the wafer is processed. Ion-ion plasmas have low effective electron temperatures (e.g., about 1 eV or less) and low electron densities (e.g., about $5 \times 10^9$ cm$^{-3}$ or less). In contrast, the plasma present in the upper sub-chamber 602 may have an effective electron temperature that is higher than the plasma in the lower sub-chamber 603, in some cases at least about twice as high, as measured in eV. Further, the plasma in the upper sub-chamber 602 may have an electron density that is higher than the plasma in the lower sub-chamber 603, for example at least ten times as high. In various embodiments this internal plasma grid 650 may be omitted, and the upper and lower sub-chambers 602 and 603 are combined into a single processing chamber. The remainder of the FIG. 6 description will focus on embodiments where the plasma grid 650 is present.

A chuck 617 is positioned within the lower sub-chamber 603 near the bottom inner surface. The chuck 617 is configured to receive and hold a semiconductor wafer 619 upon which the etching process is performed. The chuck 617 can be an electrostatic chuck for supporting the wafer when present. In some embodiments, an edge ring (not shown) surrounds chuck 617, and has an upper surface that is approximately planar with a top surface of a wafer, when present over chuck 617. The chuck 617 also includes electrostatic electrodes to enable the chucking and dechucking of the wafer. A filter and a DC clamp power supply may be provided for this purpose. Other control systems for lifting the wafer off of the chuck 617 can also be provided. The chuck 617 can be electrically charged using an RF power supply 623. The RF power supply 623 is connected to matching circuitry 621 through a connection 627. The matching circuitry 621 is connected to the chuck 617 through a connection 625. In this manner, the RF power supply 623 is connected to the chuck 617.

A coil 633 is positioned above the window 611. The coil 633 is fabricated from an electrically conductive material and includes at least one complete turn. The example coil 633 shown in FIG. 6 includes three turns. The cross-sections of coil 633 symbols having an "X" indicate that the coil 633 extends rotationally into the page. Conversely, the coil 633 symbols having a "•" indicate that the coil 633 extends rotationally out of the page. An RF power supply 641 is configured to supply RF power to the coil 633. In general, the RF power supply 641 is connected to matching circuitry 639 through a connection 645. The matching circuitry 639 is connected to the coil 633 through a connection 643. In this manner, the RF power supply 641 is connected to the coil 633. An optional Faraday shield 649 is positioned between the coil 633 and the window 611. The Faraday shield 649 is maintained in a spaced apart relationship relative to the coil 633. The Faraday shield 649 is disposed immediately above the window 611. The coil 633, the Faraday shield 649, and the window 611 are each configured to be substantially parallel to one another. The Faraday shield may prevent metal or other species from depositing on the dielectric window of the plasma chamber.

Process gases may be supplied through a main injection port 660 positioned in the upper chamber and/or through a side injection port 670, sometimes referred to as an STG. Gas exhaust ports are not shown. Also not shown are pumps connected to the chamber 601 to enable vacuum control and removal of gaseous byproducts from the chamber during operational plasma processing.

During operation of the apparatus, one or more reactant gases may be supplied through the injection ports 660 and/or 670. In certain embodiments, gas may be supplied only through the main injection port, or only through the side injection port. In some cases, the injection ports may be replaced by showerheads. The Faraday shield 649 and/or grid 650 may include internal channels and holes that allow delivery of process gas to the chamber. In other words, either or both of Faraday shield 649 and grid 650 may serve as a showerhead for delivery of process gas.

Radiofrequency power is applied from the RF power supply 641 to the coil 633 to cause an RF current to flow through the coil 633. The RF current flowing through the coil 633 generates an electromagnetic field about the coil 633. The electromagnetic field generates an inductive current within the upper sub-chamber 602. The inductive current acts on the gas present in the upper sub-chamber 602 to generate an electron-ion plasma in the upper sub-chamber 602. The internal plasma grid 650 limits the amount of hot electrons in the lower sub-chamber 603. In various embodiments, the apparatus is designed and operated such that the plasma present in the lower sub-chamber is an ion-ion plasma.

Both the upper electron-ion plasma and the lower ion-ion plasma will contain positive ions and negative ions, though the ion-ion plasma will have a greater ratio of negative ions:positive ions. The physical and chemical interactions of the various ions and radicals with the wafer 619 selectively etch features of the wafer. Volatile etching byproducts are removed from the lower sub-chamber through an exhaust port (not shown). Importantly, these volatile byproducts are substantially not exposed to hot electrons, and therefore they are not likely to be dissociated into non-volatile "sticky" dissociation products that could redeposit on the wafer.

Typically, the chuck disclosed herein operates at elevated temperatures ranging between about 30° C. and about 250° C., preferably between about 30-150° C. The temperature will depend on the etching process operation and specific recipe. The chamber 601 will also operate at pressures in the range of between about 1 mTorr and about 95 mTorr, or between about 5-20 mTorr.

Although not shown, chamber 601 is typically coupled to facilities when installed in a clean room, or a fabrication facility. Facilities include plumbing that provide processing gases, vacuum, temperature control, and environmental particle control. These facilities are coupled to chamber 601, when installed in the target fabrication facility. Additionally, chamber 601 may be coupled to a transfer chamber that will enable robotics to transfer semiconductor wafers into and out of chamber 601 using typical automation.

Apparatus and methods for performing dry etching operations are further discussed in the following U.S. Patent Applications, each of which is herein incorporate by reference in its entirety: U.S. application Ser. No. 14/082,009, filed Nov. 15, 2013, and titled "INTERNAL PLASMA GRID FOR SEMICONDUCTOR FABRICATION"; U.S. application Ser. No. 13/916,318, filed Jun. 12, 2013, and titled "INTERNAL PLASMA GRID FOR SEMICONDUCTOR FABRICATION"; and U.S. application Ser. No. 13/936,930, filed Jul. 8, 2013, and titled "ION BEAM ETCHING SYSTEM." Examples of apparatus that may be used to etch a substrate in some embodiments include the Kiyo® and Versys® family of reactors available from Lam Research Corp. of Fremont, Calif.

Figure 7:
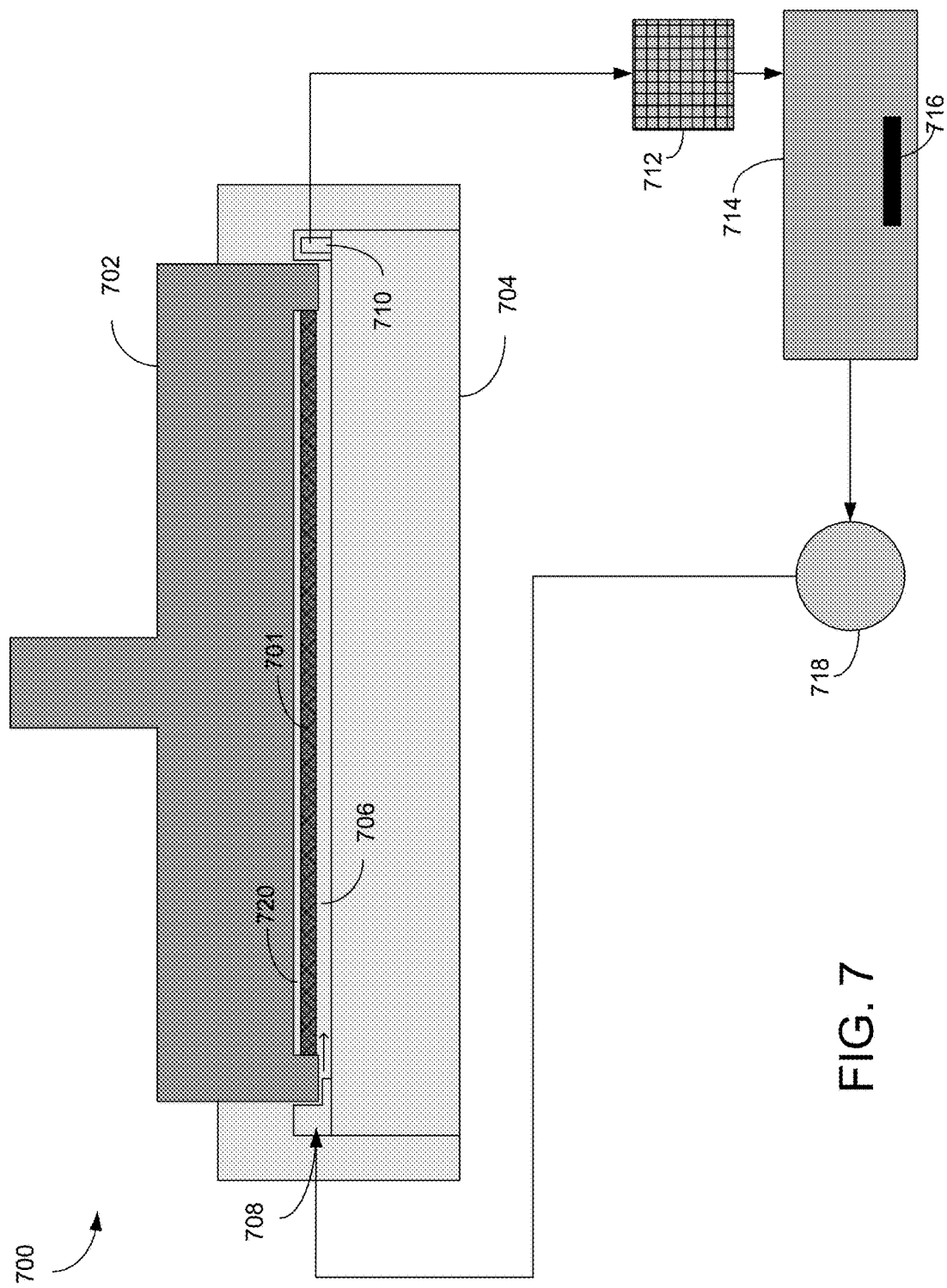
FIG. 7 depicts a simplified cross-sectional view of a stripping/removal chamber that may be used in certain embodiments.

FIG. 7 illustrates a removal cell that may be used to strip material from a substrate using wet chemistry according to certain embodiments. Other types of removal cells may be used as appropriate. In this example, a stripping process begins by receiving and sealing a substrate 701 in a substrate holder 702 of a removal cell 700. The substrate holder 702, sometimes also referred to as a wafer holder, supports the periphery of the substrate in a roughly ring-shaped cup in order to hold the substrate in place. The material to be removed (in many embodiments this is a dielectric material) faces downwards, away from the substrate holder 702. The cup may be designed such that it supports the wafer without contacting the side of the wafer not currently being processed. In the context of removing a back side layer, the cup may be designed to support the wafer without substantially contacting the front side of the wafer. To this effect, a gap 720 may be positioned above the substrate 701. The cup 702 and corresponding lip seals or other seals should be designed to ensure that chemistry used to strip material does not penetrate into the gap 720. This helps protect the other side of the wafer during the strip process. Where stripping occurs on the back side of the wafer, such seals are especially important in protecting the valuable front side deposition from damage. Other removal cell orientations (e.g., rotating the cell by 90° or 180°) may be used, so long as the wafer is adequately supported and protected.

In certain embodiments, the work piece to be stripped has a substantially horizontal orientation (which may in some cases vary by a few degrees from true horizontal for some part of, or during the entire stripping process) and is powered to rotate during stripping. The described stripping apparatus has many design features in common with analogous "fountain" plating apparatus. One example of a member of the fountain plating class of cells/apparatus is the Sabre® Electroplating System produced by and available from Lam Research Corporation of Fremont, Calif. Additionally, fountain electroplating systems are described in, e.g., U.S. Pat. No. 6,800,187, filed Aug. 10, 2001, and U.S. Pat. No. 8,308,931, filed Nov. 7, 2008, which are incorporated herein by reference in their entireties. Though the discussion herein focuses on this type of horizontal substrate orientation, other orientations are possible. In one example, the wafer may be oriented in a substantially vertical manner.

The material to be removed is typically deposited some distance away from the edge of the substrate, e.g., about 1 mm, which may leave a strip of wafer substrate exposed around the periphery of the wafer. The substrate holder 702 seals onto the substrate 701 at this exposed peripheral region. This arrangement forms a reliable seal and prevents material from being trapped by the substrate holder, which could cause that trapped material to undesirably remain on the substrate. It is beneficial to seal the substrate in the substrate holder because it helps prevent fluid leakage that may require excessive quantities of stripping chemicals and otherwise cause poor fluid dynamics (e.g., flow that is discontinuous near the edge of the wafer) within the removal cell.

The stripping process continues as the substrate 701 is rotated and immersed in stripping solution, which may be heated. The rotation may begin before, during or after immersion. In some embodiments, the rotation occurs at a rate between about 1-20 RPM, e.g., between about 5-15 RPM. In the embodiment of FIG. 7, the stripping solution fills cavity 706 between the substrate 701 and a bottom plate 704, which are substantially parallel to one another (e.g., within about 20°). The bottom plate 704 may be modified to improve flow characteristics within the cavity 706. Such modifications may include the use of protuberances or other flow disrupting elements that promote higher velocity, higher turbulence flow near the wafer. In some cases, the substrate holder may be positioned in the removal position (i.e., immersed position) before any fluid enters the cavity 706. In other cases, fluid is provided on the baseplate 704 before the substrate holder moves into the removal position. The stripping solution enters cavity 706 through a flow distributor 708, and exits cavity 706 through outlet 710. The fluid may flow at a rate between about 20-50 LPM in various cases. The flow distributor 708 includes a C-shaped internal manifold spanning a section of the peripherally located flow distributor. In one example, the internal manifold spans about 120° of the periphery of the substrate. This arrangement allows stripping solution to enter cavity 706 at one side of the cell, travel across the cavity in a substantially linear cross flow pattern, and then exit the cell at outlet 710. This produces a shearing action on the face of the substrate. Because the substrate 701 is rotating when it is immersed in stripping solution, the linear flow patterns are averaged out over the face of the wafer, providing superior material removal results. In other words, by creating a spatially uniform convective flow field under the wafer and rotating the wafer, each feature, and each die exhibits a nearly identical flow pattern over the course of the rotation and the plating process. This setup is especially beneficial for removing photoresist or other material from the front side of a wafer, where the uniformity of processing is very important. Where the stripping apparatus is used for removing material from the back side of a wafer, uniformity isn't as important and a simpler removal chamber may be appropriate.

Next, the substrate is maintained immersed in the stripping solution for a duration of time. The duration of solution exposure will depend on various factors including the chemistry involved, the temperature of the solution, the flow rate of the solution, the thickness and other geometrical characteristics of the material to be stripped, the exact geometry of the removal cell, etc. In a typical embodiment, the substrate may stay immersed until the material is completely or substantially completely removed. Where the stripping is done to remove a sacrificial back side layer, the substrate may remain immersed until the sacrificial layer and any particles on the back side of the wafer are removed. In some embodiments, complete removal is achieved in less than about 1 minute. In some implementations, the material to be removed is completely removed. In other implementations, the material is substantially completely removed (i.e., at least 99% of the material is removed). In yet other implementations, less of the material may be removed (e.g., at least 25% of the material, at least 50% of the material, at least 75% of the material, or at least 90% of the material).

After material removal, the substrate may be moved to a rinse position where it is rinsed. The rinsing solution may be provided through a rinsing nozzle (not shown), which may be mounted to the removal chamber walls (not shown), or to any other piece of the apparatus, as appropriate. In certain implementations, the nozzle may be stationary, while in other implementations, the nozzle may swing or otherwise move into place as needed. In some embodiments, a plurality of rinse nozzles may be used. The rinsing solution may be any appropriate solution, and in certain embodiments is deionized water. The rinsing operation helps remove stripping solution from the surface of the substrate, and may also help remove residual particles (e.g., of dielectric material) that may be present. The substrate may then be dried, for example through rotation of the substrate at an elevated rotation rate (e.g., between about 1000-2000 RPM).

The rinsing and drying steps may occur in the removal cell 700. Alternatively, these steps may occur in separate rinsing and/or drying modules. These modules may be implemented as part of a multi-tool apparatus, such as the one shown in FIG. 8, below.

Returning to the embodiment of FIG. 7, the stripping solution may be provided in a recirculating solution loop. A holding tank 714 may be used to hold a reservoir of stripping solution. The holding tank should be sufficiently large to hold the necessary amount of solution. The amount of solution that is needed will depend on the scale of the substrate/removal chamber/associated plumbing. In a particular embodiment, the holding tank holds about 50 L of solution.

The holding tank 714 may have a heating element 716, as well as temperature control sensors and feedback loops (not shown), which operate to maintain the stripping solution at a desired temperature. The solution exits the holding tank 714 and is delivered to pump 718, which delivers the fluid to the cross flow inlet 708. When a substrate 701 is present and the substrate holder 702 is in the stripping position, narrow cavity 706 forms between the substrate 701 and the bottom plate 704. Solution exits the cross flow inlet 708, travels through cavity 706, and exits at outlet 710. The solution then flows (in some cases over a weir wall, and in other cases through dedicated plumbing), and passes through screen 712. In some implementations, the screen 712 is fairly coarse, having openings on the order of about 1 mm, and operates to remove pieces of material (e.g., dielectric) that have fallen off of the substrate surface. The material pieces may be on the order of a centimeter or a few centimeters. The screen 712 may be located at various positions in the flow loop. In some cases the screen 712 may be a separate element through which the fluid passes before reaching the holding tank 714, as shown in FIG. 7. In other cases, the screen 712 may be incorporated into the holding tank 714. In some cases, a filter is used instead of a screen.

The screen 712 should be periodically cleaned to remove the unwanted dielectric or other material. The screen itself generally provides sufficient cleaning of the stripping solution. However, the solution should be periodically changed, or operated under a bleed-and-feed cycle, in order to provide fresh stripping solution as needed. Apparatus for performing stripping through wet chemistry is further discussed in U.S. patent application Ser. No. 13/904,283, filed May 29, 2013, and titled "APPARATUS FOR ADVANCED PACKAGING APPLICATIONS," which is herein incorporated by reference in its entirety.

Figure 8:
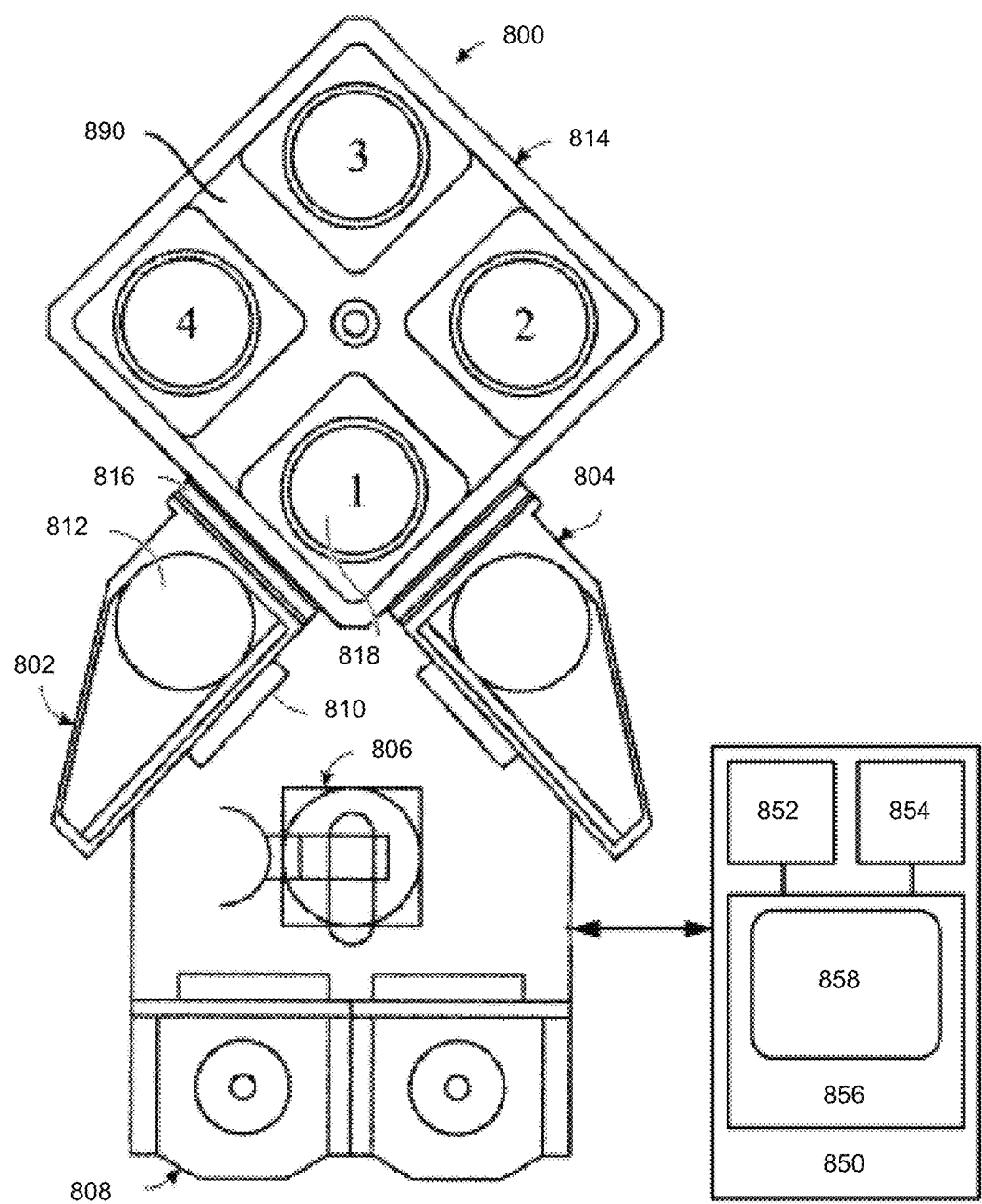
FIG. 8 shows a top-down view of a multi-tool apparatus that may be used to deposit material on the front and back sides of a wafer, as well as etch a wafer, according to certain embodiments.

As described above, one or more process stations may be included in a multi-station processing tool. FIG. 8 shows a schematic view of an embodiment of a multi-station processing tool 800 with an inbound load lock 802 and an outbound load lock 804, either or both of which may comprise a remote plasma source. A robot 806, at atmospheric pressure, is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 comprises a remote plasma source, the wafer may be exposed to a remote plasma treatment in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 comprises four process stations, numbered from 1 to 4 in the embodiment shown in FIG. 8. In various cases, one or more of the stations may be isolated to form an independent module. Any number of modules may be used. The modules may be back side deposition chambers as shown in FIG. 4A, front side deposition chambers as shown in FIG. 5, etching chambers as shown in FIG. 6, or wet processing chambers as shown in FIG. 7. Other types of modules may be used as appropriate.

Each station has a heated pedestal (shown at 818 for station 1), and gas line inlets. It will be appreciated that in some embodiments, each process station may have different or multiple purposes. For example, in some embodiments, a process station may be switchable between an ALD mode, a CFD mode, and a CVD process mode. Additionally or alternatively, in some embodiments, processing chamber 814 may include one or more matched pairs of ALD/CFD/CVD process stations. While the depicted processing chamber 814 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 also depicts an embodiment of a wafer handling system 890 for transferring wafers within processing chamber 814. In some embodiments, wafer handling system 890 may transfer wafers between various process stations/modules and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. System control software 858 may include instructions for controlling the timing, mixture of gaseous and liquid reactants, chamber and/or station pressure, chamber and/or station temperature, wafer temperature, target power levels, RF power levels, RF exposure time, substrate pedestal, chuck and/or susceptor position, and other parameters of a particular process performed by process tool 800. These programed processes may include various types of processes including, but not limited to, processes related to deposition of an undercoat, processes related to deposition of film on substrates (front side and/or back side deposition), processes related to etching a substrate, processes related to removing/stripping material from a substrate, and processes related to cleaning the chamber. System control software 858 may be configured in any suitable way. For example, various process tool component subroutines or control objects may be written to control operation of the process tool components necessary to carry out various process tool processes. System control software 858 may be coded in any suitable computer readable programming language.

In some embodiments, system control software 858 may include input/output control (IOC) sequencing instructions for controlling the various parameters described above. For example, each phase of a conditioning layer deposition process may include one or more instructions for execution by system controller 850. The instructions for setting process conditions for a conditioning layer deposition process phase may be included in a corresponding conditioning layer deposition recipe phase. In some embodiments, the recipe phases may be sequentially arranged, so that all instructions for a process phase are executed concurrently with that process phase.

Other computer software and/or programs stored on mass storage device 854 and/or memory device 856 associated with system controller 850 may be employed in some embodiments. Examples of programs or sections of programs for this purpose include a substrate positioning program, a process gas control program, a process liquid control program, a pressure control program, a heater control program, and a plasma control program.

A substrate positioning program may include program code for process tool components that are used to load the substrate onto pedestal 818 and to control the spacing between the substrate and other parts of process tool 800. The positioning program may include instructions for appropriately moving substrates in and out of the reaction chamber as necessary to deposit the conditioning layers, deposit films on substrates, and clean the chamber. These may include instructions for ensuring that no substrates are present in the reaction chamber during deposition of the conditioning layers and during the cleaning process.

A process gas control program may include code for controlling gas composition and flow rates and optionally for flowing gas into one or more process stations prior to deposition in order to stabilize the pressure in the process station. A process liquid control program may include code for controlling processing liquid composition, and flow rates for introducing processing liquids (e.g., stripping solutions) into a processing module. A pressure control program may include code for controlling the pressure in the process station by regulating, for example, a throttle valve in the exhaust system of the process station, a gas flow into the process station, etc. A heater control program may include code for controlling the current to a heating unit that is used to heat the substrate. Alternatively or in addition, the heater control program may control delivery of a heat transfer gas (such as helium) to the substrate. A plasma control program may include code for setting RF power levels, frequencies, duty cycles, and exposure times in one or more process stations in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas (or liquid) composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable, non-transitory media containing instructions for controlling process operations in accordance with the present invention may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. An apparatus for depositing a film on a back side of a substrate, comprising:
    a reaction chamber;
    a substrate support in the reaction chamber configured to support the substrate at or near its periphery during deposition such that an active region on a front side of the substrate does not contact any portion of the reaction chamber, and such that a back side of the substrate is substantially exposed;
    an electrode positioned above the substrate support;
    a second electrode positioned below the substrate support;
    a deposition region defined on one side by the back side of the substrate, when present, wherein a height of the deposition region is between about 5-30 mm;
    a front side gap defined on one side by the front side of the substrate, when present, wherein a height of the front side gap is about 0.5 mm or less;
    a top side inlet for providing an inert gas to the front side gap, wherein the top side inlet is positioned to deliver the inert gas near the center of the front side of the substrate, when the substrate is present, such that the inert gas flows from the center of the substrate outwards over the front face of the substrate;
    a deposition region inlet for providing a reactant gas to the deposition region; and
    a controller configured to execute instructions for (i) using the electrode and the second electrode to generate a plasma in the deposition region such that the back side of the substrate is exposed to the plasma to deposit the film on the back side of the substrate without depositing film on the front side of the substrate, (ii) generating the plasma such that a thickness of a plasma sheath on the plasma is greater than the height of the front side gap to thereby prevent the plasma from penetrating the front side gap, and (iii) controlling a flow of the inert gas through the top side inlet to prevent material from depositing on the front side of the substrate during deposition on the back side of the substrate;
    wherein a position of the substrate support and a position of the electrode are adjustable, and wherein adjusting the position of the substrate support and the position of the electrode varies the height of the deposition region.

2. The apparatus of claim 1, wherein one or more parts of the reaction chamber are movable such that the height of the front side gap and the height of the deposition region may each be changed.

3. The apparatus of claim 1, wherein the substrate support comprises a support ring.

4. The apparatus of claim 1, wherein the substrate support is configured to support the substrate such that the entire front side of the substrate does not contact any portion of the reaction chamber.

5. A multi-tool semiconductor processing apparatus, comprising:
- a front side module for depositing material on a front side of a substrate, the front side of the substrate comprising an active region on the substrate;
- a back side module for depositing material on a back side of the substrate, the back side module comprising:
  - a substrate support configured to support the substrate at or near its periphery during deposition such that the active region on a front side of the substrate does not contact any portion of the back side module, and such that a back side of the substrate is substantially exposed,
  - an electrode positioned above the substrate support,
  - a second electrode positioned below the substrate support,
  - a deposition region defined on one side by the back side of the substrate, when present, wherein the deposition region has a height between about 5-30 mm,
  - a front side gap defined on one side by the front side of the substrate, when present, wherein the front side gap has a height of about 0.5 mm or less, wherein a position of the substrate support and a position of the electrode are adjustable, and wherein moving the substrate support and electrode varies the height of the deposition region, wherein the back side module is configured to deliver gas phase reactants;
  - a top side inlet for providing an inert gas to the front side gap, wherein the top side inlet is positioned to deliver the inert gas near the center of the front side of the substrate, when the substrate is present, such that the inert gas flows from the center of the substrate outwards over the front face of the substrate; and
- a controller configured to execute instructions for:
  - depositing material on the front side of the substrate in the front side module,
  - transferring the substrate to the back side module, and
  - using the electrode and the second electrode to generate a plasma in the deposition region such that the back side of the substrate is exposed to the plasma to deposit material on the back side of the substrate without concurrently depositing film on the front side of the substrate,
  - generating the plasma such that a thickness of a plasma sheath on the plasma is greater than the height of the front side gap to thereby prevent the plasma from penetrating the front side gap, and
  - controlling a flow of the inert gas through the top side inlet to prevent material from depositing on the front side of the substrate during deposition on the back side of the substrate.

6. The multi-tool semiconductor processing apparatus of claim 5, further comprising an etching module for etching the substrate.

7. The apparatus of claim 1, wherein the substrate support is configured to support the substrate such that the front side of the substrate faces upwards and the back side of the substrate faces downwards.

8. The apparatus of claim 1, wherein the height of the deposition region is defined as a distance between the back side of the substrate, when present, and a bottom surface positioned below the substrate.

9. The apparatus of claim 1, wherein the controller comprises instructions for depositing the film on the back side of the substrate through a gas phase plasma enhanced chemical vapor deposition reaction using the reactant gas.

* * * * *